United States Patent
Hatakeyama et al.

(10) Patent No.: US 11,327,400 B2
(45) Date of Patent: *May 10, 2022

(54) PATTERNING PROCESS

(71) Applicant: Shin-Etsu Chemical Co., Ltd., Tokyo (JP)

(72) Inventors: Jun Hatakeyama, Joetsu (JP); Takeshi Sasami, Joetsu (JP); Tomohiro Kobayashi, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 131 days.

This patent is subject to a terminal disclaimer.

(21) Appl. No.: 16/194,593

(22) Filed: Nov. 19, 2018

(65) Prior Publication Data

US 2019/0163065 A1 May 30, 2019

(30) Foreign Application Priority Data

Nov. 29, 2017 (JP) .............................. JP2017-229144

(51) Int. Cl.
| | | |
|---|---|---|
| *G03F 7/039* | (2006.01) | |
| *G03F 7/20* | (2006.01) | |
| *G03F 7/40* | (2006.01) | |
| *G03F 7/38* | (2006.01) | |
| *G03F 7/32* | (2006.01) | |
| *G03F 7/004* | (2006.01) | |

(52) U.S. Cl.
CPC .......... *G03F 7/2002* (2013.01); *G03F 7/0392* (2013.01); *G03F 7/0397* (2013.01); *G03F 7/322* (2013.01); *G03F 7/38* (2013.01); *G03F 7/40* (2013.01); *G03F 7/0045* (2013.01); *G03F 7/039* (2013.01)

(58) Field of Classification Search
CPC .... G03F 7/0045; G03F 7/0392; G03F 7/0397; G03F 7/2002; G03F 7/039
See application file for complete search history.

(56) References Cited

U.S. PATENT DOCUMENTS

| | | | |
|---|---|---|---|
| 5,712,078 A | 1/1998 | Huang et al. | |
| 9,360,753 B2 * | 6/2016 | Hatakeyama | G03F 7/0046 |
| 9,823,564 B2 | 11/2017 | Stowers et al. | |
| 10,520,809 B2 * | 12/2019 | Hatakeyama | G03F 7/0395 |
| 10,520,811 B2 * | 12/2019 | Hatakeyama | G03F 7/0397 |
| 10,606,172 B2 * | 3/2020 | Hatakeyama | C08F 220/16 |
| 10,613,436 B2 * | 4/2020 | Hatakeyama | C08F 220/28 |
| 10,613,437 B2 * | 4/2020 | Hatakeyama | C07C 309/04 |
| 10,725,378 B2 * | 7/2020 | Hatakeyama | G03F 7/0045 |
| 10,802,400 B2 * | 10/2020 | Hatakeyama | C08F 220/16 |
| 10,816,899 B2 * | 10/2020 | Hatakeyama | G03F 7/0382 |
| 10,968,175 B2 * | 4/2021 | Hatakeyama | G03F 7/38 |
| 11,022,883 B2 * | 6/2021 | Hatakeyama | C08F 220/30 |
| 11,048,165 B2 * | 6/2021 | Hatakeyama | G03F 7/162 |
| 2017/0008982 A1 * | 1/2017 | Hasegawa | C08F 116/14 |
| 2017/0029547 A1 * | 2/2017 | Hatakeyama | G03F 7/085 |
| 2017/0351177 A1 * | 12/2017 | Hatakeyama | C07C 65/05 |
| 2018/0273664 A1 | 9/2018 | Enomoto et al. | |
| 2019/0113844 A1 * | 4/2019 | Hatakeyama | G03F 7/0392 |

FOREIGN PATENT DOCUMENTS

| | | |
|---|---|---|
| JP | 3014350 B2 | 2/2000 |
| JP | 4425776 B2 | 3/2010 |
| JP | 2016-29498 A | 3/2016 |
| WO | 2017/057537 A1 | 4/2017 |

OTHER PUBLICATIONS

Nakamura et al., "Effect of Acid Diffusion on Resolution of a Chemically Amplified Resist in X-Ray Lithography", Japanese Journal of Applied Physics, Oct. 1991, vol. 30, No. 10, pp. 2619-2625 (7 pages).
Gronheid et al., "EUV Secondary Electron Blur at the 22NM Half Pitch Node", SPIE, 2011, vol. 7969, pp. 796904-1-11 (11 pages).
Office Action dated Aug. 31, 2021, issued in counterpart JP application No. 2018-209744, with English translation. (3 pages).

* cited by examiner

*Primary Examiner* — Daborah Chacko-Davis
(74) *Attorney, Agent, or Firm* — Westerman, Hattori, Daniels & Adrian, LLP

(57) ABSTRACT

A pattern having a good balance of sensitivity, resolution and LWR is formed by providing a resist film comprising a base resin comprising recurring units having a $C_4$-$C_6$ tertiary alkoxy or alkoxycarbonyl group as an acid labile group and recurring units capable of generating a backbone-bound acid upon exposure, exposing the resist film to radiation, optionally post-exposure baking the resist film at a low temperature of 30-70° C., and developing the film.

14 Claims, No Drawings

PATTERNING PROCESS

CROSS-REFERENCE TO RELATED APPLICATION

This non-provisional application claims priority under 35 U.S.C. § 119(a) on Patent Application No. 2017-229144 filed in Japan on Nov. 29, 2017, the entire contents of which are hereby incorporated by reference.

TECHNICAL FIELD

This invention relates to a pattern forming process.

BACKGROUND ART

To meet the demand for higher integration density and operating speed of LSIs, the effort to reduce the pattern rule is in rapid progress. In particular, the enlargement of the logic memory market to comply with the wide-spread use of smart phones drives forward the miniaturization technology. As the advanced miniaturization technology, manufacturing of microelectronic devices at the 10-nm node by double patterning of the ArF immersion lithography has been implemented in a mass scale. Manufacturing of 7-nm node devices as the next generation by the double patterning technology is approaching to the verge of high-volume application. The candidate for 5-nm node devices as the next generation but one is EUV lithography.

Recently, the pattern feature size is reduced to 10 nm or below as the minimum line width, approaching to the resolution limit of chemically amplified resists. It is pointed out that the chemically amplified resist encounters a drop of resolution due to image blur by acid diffusion. Studies have been made to reduce the acid diffusion distance for boosting the resolution limit. In these studies, the acid diffusion distance is measured by a variety of techniques as described in Non-Patent Documents 1 and 2.

For the purpose of shrinking the acid diffusion of chemically amplified resist, in the case of positive resist materials, it is effective to lower the temperature or to shorten the time of post-exposure bake (PEB) step for incurring deprotection reaction to increase alkaline solubility to form a pattern. Non-Patent Documents 1 and 2 describe that the lower the PEB temperature, the shorter becomes the acid diffusion distance. Patent Document 1 discloses a resist material comprising a polymer having a ketal protective group requiring a low activation energy for deprotection reaction. A pattern is formed by developing the resist film while omitting PEB.

Where the acid labile group is an acetal group or a ketal group as in Patent Document 1, deprotection reaction takes place without PEB. In the case of a low molecular weight dissolution inhibitor substituted with a tert-butoxycarbonyl group as shown in Non-Patent Document 1, deprotection reaction takes place during PEB at low temperature, resulting in an improvement in alkaline solubility. However, these materials have the nature that acid diffusion is prominent despite PEB at low temperature. A polymer having an acetal or ketal group requiring a low activation energy or a low molecular weight compound having an acid labile group substituted thereon fails to control acid diffusion even when PEB is at low temperature.

Other means for shortening acid diffusion include the use of an acid generator capable of generating a less diffusing bulky acid and the use of a polymer containing a structure functioning as acid generator (i.e., polymer-bound acid generator) as described in Patent Document 2. Included in the polymer-bound acid generator are a cation-bound acid generator which is bonded to the polymer backbone on the cation side, and an anion-bound acid generator which is bonded to the polymer backbone on the anion side. Upon light exposure, the cation-bound acid generator generates a free acid whereas the anion-bound acid generator generates an acid bound to the polymer backbone. Thus, the anion-bound acid generator is characterized by less diffusion.

A non-chemically amplified resist material is reconsidered because it is devoid of image blur by acid diffusion. However, the non-chemically amplified resist material has a very low sensitivity and a low contrast. It is thus difficult to form a two-dimensional pattern of rectangular profile with a wide margin.

Patent Document 3 describes a non-chemically amplified resist material base on a tin atom capable of substantial absorption of EUV. Among other non-chemically amplified resist materials, this material exhibits an accordingly high sensitivity, high resolution and low edge roughness (LWR) by virtue of substantial absorption. However, the crosslinking negative resist material is accompanied by a risk of forming bridge defects. There is also the risk of EUV mask blank defects because a bright mask must be used in order to form a hole pattern. The front end process to form transistors for logic circuits cannot use metal-based resists because metal contamination should be avoided and because of the risk of contaminating the exposure tool shared by the front end and the back end.

A positive resist material is advantageous in forming hole and trench patterns. There is the demand for a metal-free, novel organic compound based resist material exhibiting a high sensitivity and high resolution.

CITATION LIST

Patent Document 1: JP 3014350
Patent Document 2: JP 4425776
Patent Document 3: JP-A 2016-029498 (U.S. Pat. No. 9,823,564)
Non-Patent Document 1: Jpn. Journal of Applied Physics, Vol. 30, No. 10, October, p2619 (1991)
Non-Patent Document 2: SPIE, Vol. 7969, p796904-1 (2011)

DISCLOSURE OF INVENTION

Under the circumstance that the pattern rule is progressively reduced to meet the demand for LSIs with higher integration density and operating speed as discussed above, it is desired to have a resist material exhibiting a high sensitivity despite a high resolution and forming a pattern of good profile with a low LWR after exposure.

An object of the invention is to provide a process for forming a pattern of good profile at a high sensitivity, high resolution, and low LWR after exposure.

The inventors have found that by exposing to light a resist film comprising a base resin or polymer comprising recurring units having a $C_4$-$C_6$ tertiary alkoxy or alkoxycarbonyl group with a high activation energy as an acid labile group and recurring units capable of generating a backbone-bound acid upon exposure (anion-bound acid generator), optionally post-exposure baking (PEB) the resist film at a low temperature of 30 to 70° C., and developing the resist film, a positive pattern having a good balance of sensitivity, resolution and LWR is formed because the dissolution contrast is improved by an extremely short acid diffusion distance.

Accordingly, the invention provides a process for forming a pattern, comprising the steps of:

(i) exposing a resist film comprising a base resin to high-energy radiation, the base resin comprising recurring units having the formula (a1) and/or recurring units having the formula (a2), and recurring units capable of generating a polymer backbone-bound acid upon exposure, (ii) optionally post-exposure baking the resist film at 30 to 70° C., and (iii) developing the resist film after step (ii).

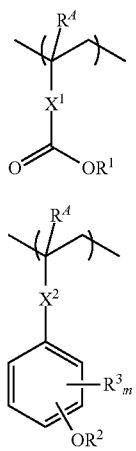

(a1)

(a2)

Herein $R^A$ is each independently hydrogen or methyl, $R^1$ and $R^2$ are each independently a $C_4$-$C_6$ tertiary alkyl group, $R^3$ is each independently fluorine or methyl, m is an integer of 0 to 4, $X^1$ is a single bond, phenylene group, naphthylene group, or a $C_1$-$C_{12}$ linking group containing at least one moiety selected from an ester bond, lactone ring, phenylene and naphthylene, and $X^2$ is a single bond, ester bond or amide bond.

Preferably, the $C_4$-$C_6$ tertiary alkyl group is tert-butyl, tert-pentyl, 1-methylcyclobutyl, 3-methyl-3-pentyl, or 1-methylcyclopentyl.

In a preferred embodiment, the recurring units capable of generating a polymer backbone-bound acid upon exposure have the formula (b1) or (b2).

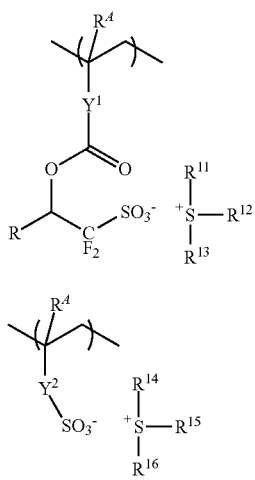

(b1)

(b2)

Herein $R^A$ is as defined above, R is hydrogen or trifluoromethyl, $Y^1$ is a single bond, —C(=O)—O—$Z^1$— or —C(=O)—NH—$Z^1$—, $Y^2$ is a single bond, methylene, ethylene, phenylene, fluorinated phenylene, —O—$Z^1$—, —C(=O)—O—$Z^1$—, or —C(=O)—NH—$Z^1$—, $Z^1$ is a $C_1$-$C_{10}$ alkanediyl, phenylene, or $C_1$-$C_{10}$ alkenediyl group, in which at least one hydrogen may be substituted by hydroxyl, and at least one carbon may be substituted by carbonyl, ester bond or ether bond, $R^{11}$ to $R^{16}$ are each independently a $C_1$-$C_{20}$ monovalent hydrocarbon group which may contain a heteroatom, any two of $R^{11}$ to $R^{13}$ may bond together directly or via a methylene group or ether bond to form a ring with the sulfur atom to which they are attached, and any two of $R^{14}$ to $R^{16}$ may bond together directly or via a methylene group or ether bond to form a ring with the sulfur atom to which they are attached.

In one preferred embodiment, the resist film is not baked in step (ii).

In another preferred embodiment, the resist film is baked (PEB) at a temperature of 30 to 70° C. in step (ii). Typically, step (ii) includes baking the resist film in an atmosphere at a temperature of 30 to 70° C. Preferably, the PEB temperature is in a range of 35 to 65° C., more preferably 40 to 60° C.

The pattern forming process may further comprise, between steps (ii) and (iii), the step of exposing the resist film to an atmosphere containing a basic substance to neutralize the acid in the resist film.

In a preferred embodiment, step (iii) includes developing the resist film in an alkaline aqueous solution as a developer to form a positive pattern.

Typically, the high-energy radiation is EUV of wavelength 3 to 15 nm or EB at an accelerating voltage of 1 to 150 kV.

Advantageous Effects of Invention

The base resin used in the pattern forming process of the invention is improved in alkaline solubility upon light exposure through the mechanism that the backbone-bound acid generator is decomposed to generate a backbone-bound acid. A low hydrophobic polymer is dissolvable in alkaline aqueous solution without PEB, while the pattern formed without PEB is a pattern of non-chemically amplified resist material. In this case, a high resolution is expectable despite a low sensitivity because the image blur by acid diffusion is eliminated. Since a low hydrophobic polymer having an acid labile group of a small carbon count, i.e., 4 to 6 carbon atoms, has a high activation energy, only a few acid labile groups are deprotected by PEB at low temperature, in contrast to the standard process involving PEB at high temperature of 90° C. or above, whereby sensitivity and dissolution contrast are improved and LWR is reduced. Therefore, the pattern forming process of the invention has the advantages of both non-chemically amplified resist material and chemically amplified resist material, achieving a good balance of sensitivity and resolution due to minimized acid diffusion.

DESCRIPTION OF PREFERRED EMBODIMENTS

As used herein, the singular forms "a," "an" and "the" include plural referents unless the context clearly dictates otherwise. "Optional" or "optionally" means that the subsequently described event or circumstances may or may not occur, and that description includes instances where the event or circumstance occurs and instances where it does not. The notation ($C_n$-$C_m$) means a group containing from n to m carbon atoms per group.

The abbreviations and acronyms have the following meaning.
EB: electron beam
EUV: extreme ultraviolet
Mw: weight average molecular weight
Mn: number average molecular weight
Mw/Mn: molecular weight distribution or dispersity
GPC: gel permeation chromatography
PEB: post-exposure bake
PAG: photoacid generator
LWR: line width roughness Pattern Forming Process The invention provides a process for forming a pattern, comprising the steps of:

(i) exposing a resist film comprising a base resin to high-energy radiation, the base resin comprising recurring units having a $C_4$-$C_6$ tertiary alkoxy or alkoxycarbonyl group as an acid labile group and recurring units capable of generating a polymer backbone-bound acid upon exposure, (ii) optionally post-exposure baking the resist film at a temperature of 30 to 70° C., and (iii) developing the resist film after step (ii).

Step (i)

In step (i), a resist film comprising a base resin is exposed to high-energy radiation, the base resin comprising recurring units having a $C_4$-$C_6$ tertiary alkoxy or alkoxycarbonyl group as an acid labile group and recurring units capable of generating a polymer backbone-bound acid upon light exposure. The resist film may be formed by coating a resist composition containing the base resin to a substrate and prebaking the coating. The resist composition will be described later.

For example, the resist composition is first applied onto a substrate or a processable layer thereon on which an integrated circuit is to be formed (e.g., Si, $SiO_2$, SiN, SiON, TiN, WSi, BPSG, SOG, or organic antireflective coating), or a substrate or a processable layer thereon on which a mask circuit is to be formed (e.g., Cr, CrO, CrON, $MoSi_2$, or $SiO_2$) by a suitable coating technique such as spin coating, roll coating, flow coating, dipping, spraying or doctor coating. The coating is prebaked on a hot plate at a temperature of 60 to 150° C. for 10 seconds to 30 minutes, preferably at 80 to 120° C. for 30 seconds to 20 minutes. The resulting resist film is generally 0.1 to 2.0 µm thick.

The resist film is then exposed to a desired pattern of high-energy radiation such as UV, deep-UV, EB at an accelerating voltage of 1 to 150 kV, EUV of wavelength 3 to 15 nm, x-ray, soft x-ray, excimer laser light, γ-ray or synchrotron radiation, directly or through a mask. The exposure dose is preferably about 1 to 300 mJ/cm², more preferably about 10 to 200 mJ/cm², or about 1 to 500 µC/cm², more preferably about 5 to 400 µC/cm².

Step (ii)

In step (ii), the resist film is optionally baked (PEB) at a temperature of 30 to 70° C. Where PEB is carried out, the PEB temperature is preferably 35 to 65° C., more preferably 40 to 60° C., and the PEB time is preferably 10 seconds to 30 minutes, more preferably 10 seconds to 20 minutes.

The pattern forming process is characterized by omission of PEB or PEB at a low temperature of 30 to 70° C. Where PEB is carried out, the bake may be performed on a hot plate or by infrared irradiation, laser irradiation, hot air blowing, or placement of a wafer in a PEB temperature atmosphere.

In the embodiment wherein the polymer is an anion-bound PAG polymer comprising recurring units (b1) or (b2), a sulfonic acid is generated upon exposure whereby alkaline solubility is improved. Then the exposed region of the resist film is dissolvable in alkaline solution without PEB. When PEB is omitted, the image blur by acid diffusion is eliminated, and so, the formation of a pattern of finer size than the pattern formation via PEB is expected.

When PEB is omitted, the resist material is a non-chemically amplified resist material. In this case, the dissolution contrast is so low that after development, a pattern film thickness loss or the residual film in the space region can occur. For the non-chemically amplified resist material, the key is how to improve dissolution contrast.

In the embodiment wherein the polymer is an anion-bound PAG polymer comprising recurring units (b1) or (b2), an α-fluorosulfonic acid is generated upon exposure whereby the solubility in alkaline developer is improved. When an onium salt of α-non-fluorinated sulfonic acid or carboxylic acid is added, the generation of an α-fluorosulfonic acid is controlled by a salt exchange therewith. Further, as the exposure dose is increased, the onium salt of α-non-fluorinated sulfonic acid or carboxylic acid is decomposed, whereby alkaline solubility is improved. Namely, contrast is enhanced by the mechanism that dissolution inhibition is improved in the under-exposure dose region whereas dissolution promotion is improved in the over-exposure dose region. Since the ion exchange reaction proceeds rapidly at room temperature, the PEB may be omitted.

Most of the current wafer heating methods use a hot plate. Once a silicon wafer is rested on a hot plate, the resist film is heated by heat conduction through the wafer. The resist film heating temperature may be adjusted by controlling the temperature of the hot plate.

In the case of hot plates, temperature control in the range of 80 to 200° C. is accurate. At temperatures below the range, the temperature difference between the resist film and the hot plate becomes so small that the heat conduction rate may become slow. Thus, the accuracy of temperature control becomes lower.

On the other hand, the method of heating a wafer in a desired temperature atmosphere has the advantages of a quick heat conduction rate and a high heating accuracy because the resist film is directly heated by gas or air in contact therewith. One exemplary method is heating in a chamber. In this case, temperature control within the chamber is crucial. It is necessary to control the temperature preferably within 2° C., more preferably within 1° C., most preferably within 0.5° C. from the desired temperature. The chamber interior may be an air atmosphere or an inert gas atmosphere such as nitrogen or argon.

After the PEB (ii) and before step (iii), the resist film may be exposed to an atmosphere containing a basic substance vapor for inactivating the acid generated by the acid generator. Since this vapor exposure terminates catalytic reaction, the sensitivity of the resist film no longer changes with a varying time until development. The preferred basic substances are amine compounds having a high vapor pressure such as ammonia, trimethylamine, triethylamine, tripropylamine, and butylamine.

Step (iii)

In step (iii) following PEB, the resist film is developed. Specifically, the resist film is developed in a developer in the form of an aqueous base solution for 3 seconds to 3 minutes, preferably 5 seconds to 2 minutes by conventional techniques such as dip, puddle and spray techniques. A typical developer is a 0.1 to 5 wt %, preferably 2 to 3 wt % aqueous solution of tetramethylammonium hydroxide (TMAH), choline hydroxide, tetraethylammonium hydroxide (TEAH), tetrapropylammonium hydroxide (TPAH), tetrabutylammonium hydroxide (TBAH), benzyltrimethylammonium hydroxide or benzyltriethylammonium hydroxide. The resist film in the exposed area is dissolved in the developer whereas the resist film in the unexposed area is not dissolved. In this way, the desired positive pattern is formed on the substrate.

Resist Composition

As described above, the resist film is formed of a resist composition comprising a base resin, the base resin comprising recurring units containing a $C_4$-$C_6$ tertiary alkoxy or alkoxycarbonyl group as an acid labile group and recurring units capable of generating a polymer backbone-bound acid upon light exposure.

The recurring units containing an acid labile group have the formula (a1) or (a2).

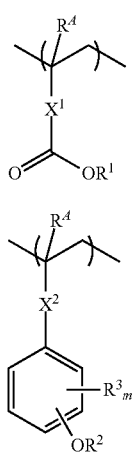

(a1)

(a2)

In formulae (a1) and (a2), $R^A$ is each independently hydrogen or methyl. $R^1$ and $R^2$ are each independently a $C_4$-$C_6$ tertiary alkyl group. $R^3$ is each independently fluorine or methyl, and m is an integer of 0 to 4. $X^1$ is a single bond, phenylene group, naphthylene group, or a $C_1$-$C_{12}$ linking group containing at least one moiety selected from an ester bond, lactone ring, phenylene and naphthylene. $X^2$ is a single bond, ester bond or amide bond.

The $C_4$-$C_6$ tertiary alkyl group is preferably tert-butyl, tert-pentyl, 1-methylcyclobutyl, 3-methyl-3-pentyl, or 1-methylcyclopentyl.

Examples of the monomer from which recurring units having formula (a1), simply referred to as recurring units (a1), hereinafter, are derived are shown below, but not limited thereto. Herein $R^A$ and $R^1$ are as defined above.

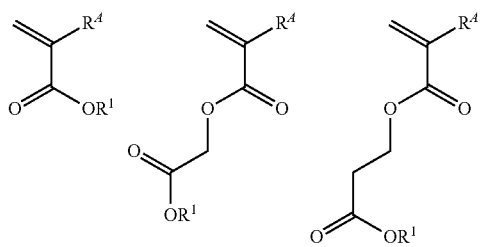

-continued

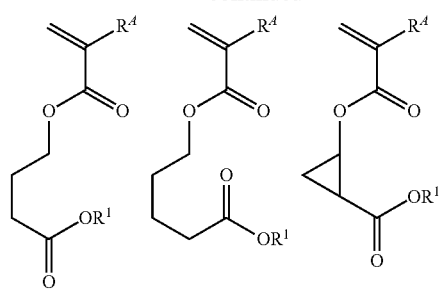

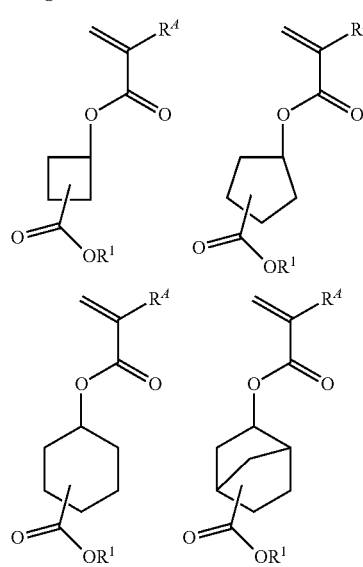

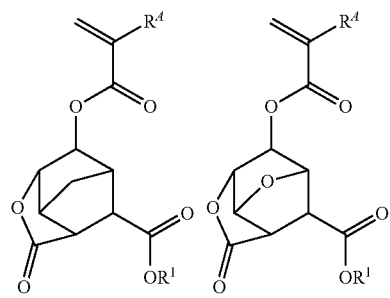

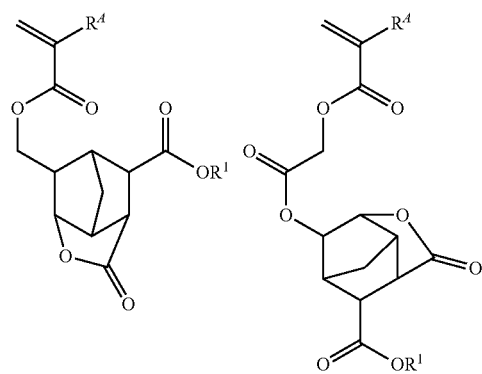

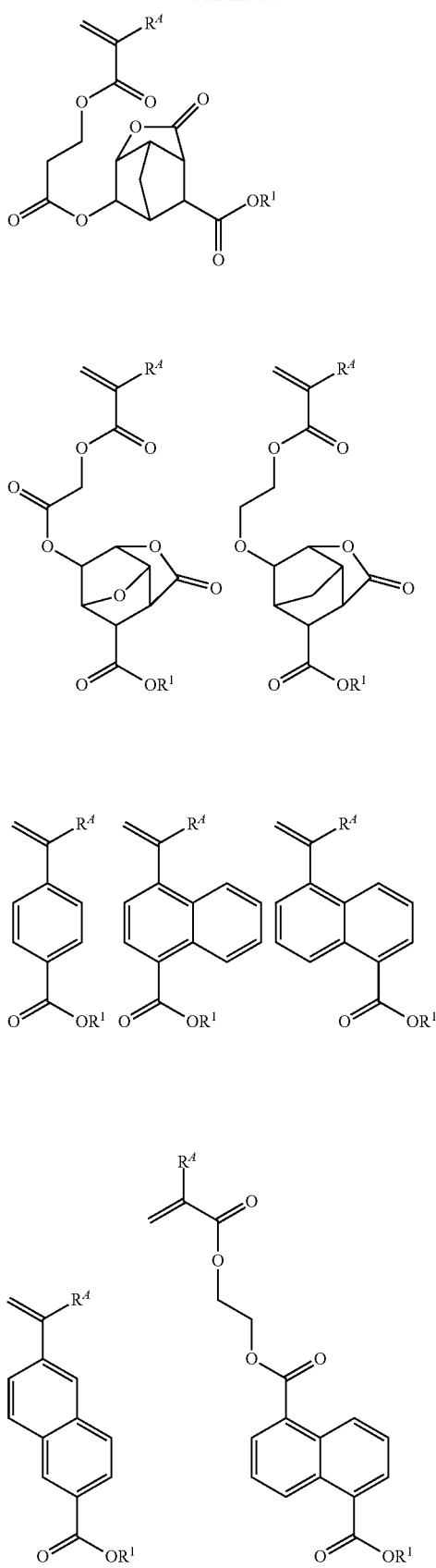
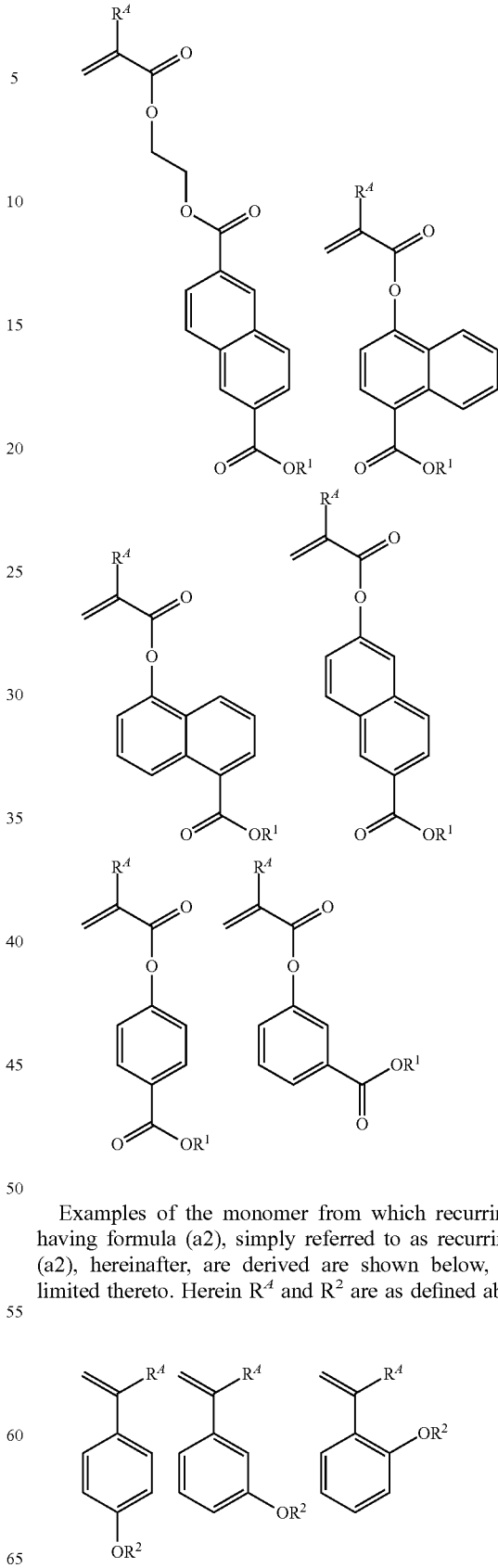
Examples of the monomer from which recurring units having formula (a2), simply referred to as recurring units (a2), hereinafter, are derived are shown below, but not limited thereto. Herein $R^4$ and $R^2$ are as defined above.

-continued

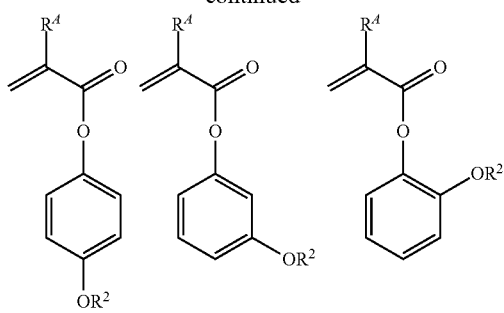
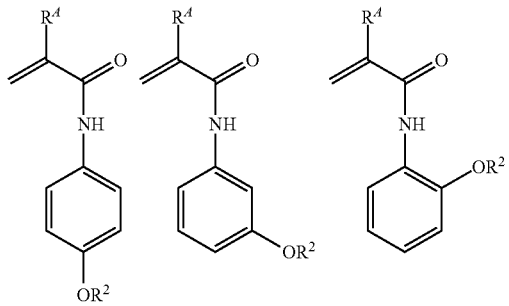
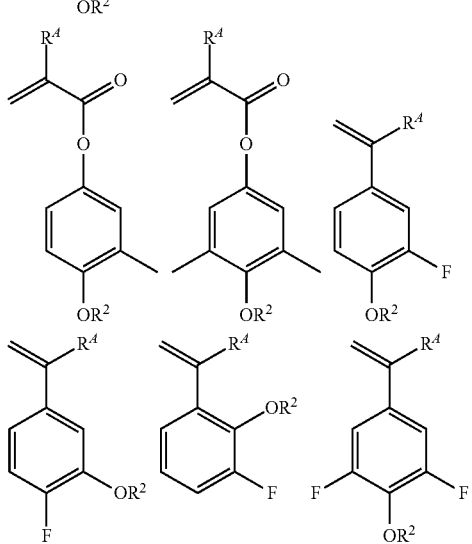
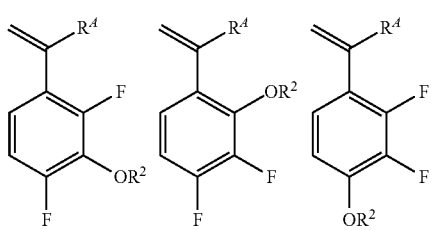
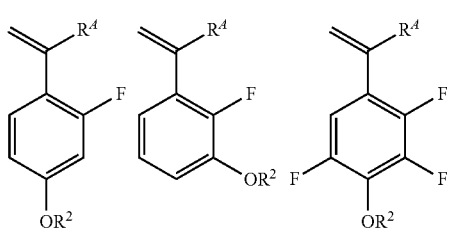

-continued

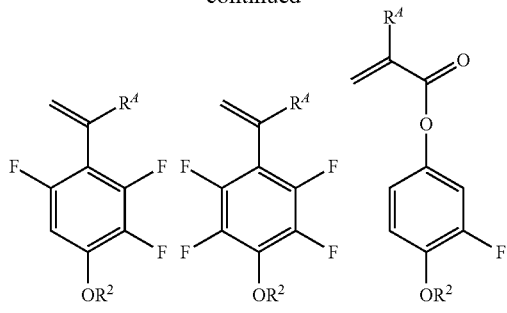
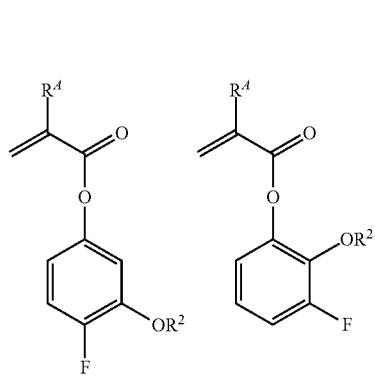
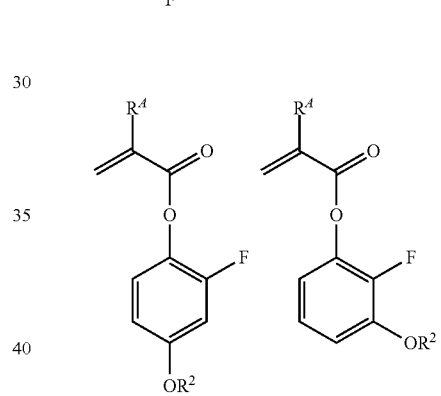
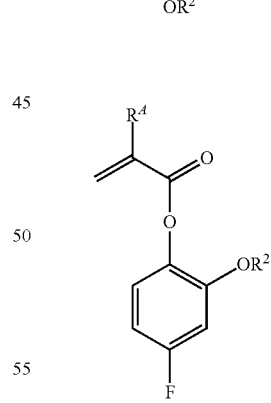

The recurring units (a1) may be used singly or in a combination of two or more. The recurring units (a2) may be used singly or in a combination of two or more. Further recurring units (a1) and (a2) may be used in combination.

The recurring units capable of generating an acid upon light exposure are preferably recurring units having the formula (b1) or (b2). Notably, the recurring units having formula (b1) or (b2) are simply referred to as recurring units (b1) or (b2), hereinafter.

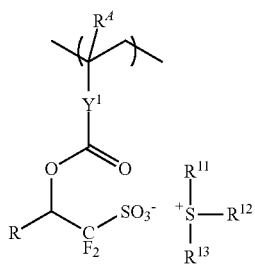
(b1)

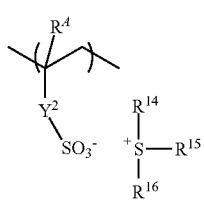
(b2)

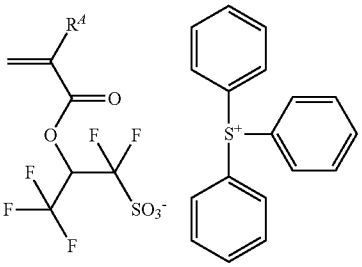

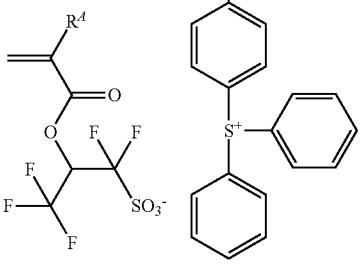

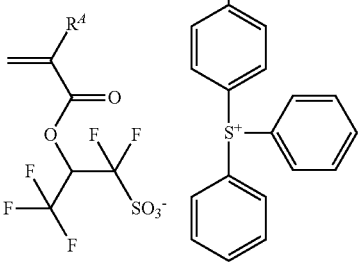

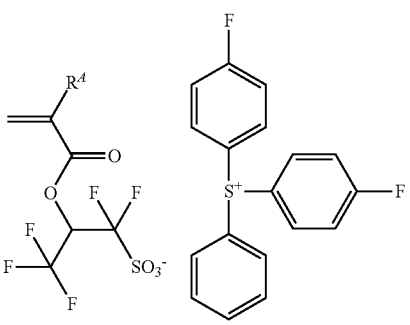

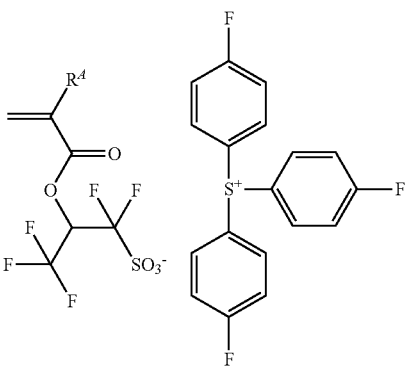

In formulae (b1) and (b2), $R^A$ is as defined above. R is hydrogen or trifluoromethyl. $Y^1$ is a single bond, —C(=O)—O—$Z^1$— or —C(=O)—NH—$Z^1$—. $Y^2$ is a single bond, methylene, ethylene, phenylene, fluorinated phenylene, —O—$Z^1$—, —C(=O)—O—$Z^1$—, or —C(=O)—NH—$Z^1$—. $Z^1$ is a $C_1$-$C_{10}$ alkanediyl, phenylene, or $C_1$-$C_{10}$ alkenediyl group, in which at least one hydrogen may be substituted by hydroxyl, or at least one carbon may be substituted by carbonyl, ester bond or ether bond. The alkanediyl and alkenediyl groups may be straight, branched or cyclic.

In formulae (b1) and (b2), $R^{11}$ to $R^{16}$ are each independently a $C_1$-$C_{20}$ monovalent hydrocarbon group which may contain a heteroatom. Any two of $R^{11}$ to $R^{13}$ may bond together directly or via a methylene group or ether bond to form a ring with the sulfur atom to which they are attached, and any two of $R^{14}$ to $R^{16}$ may bond together directly or via a methylene group or ether bond to form a ring with the sulfur atom to which they are attached.

The monovalent hydrocarbon group may be straight, branched or cyclic. Examples include $C_1$-$C_{20}$ alkyl groups, $C_2$-$C_{20}$ alkenyl groups, $C_2$-$C_{20}$ alkynyl groups, $C_6$-$C_{20}$ aryl groups, and $C_7$-$C_{20}$ aralkyl groups. Also included are substituted forms of the foregoing groups in which one or more or even all hydrogen is substituted by a hydroxyl, carboxyl, halogen, cyano, amide, nitro, mercapto, sultone, sulfone or sulfonium salt-containing moiety, or in which one or more carbon is substituted by an ether bond, ester bond, carbonyl moiety, carbonate moiety or sulfonic acid ester bond.

By binding the acid generator to the polymer backbone, it becomes possible to shrink the acid diffusion distance, to reduce LWR, and to enhance alkaline solubility of the exposed area.

Of the recurring units (b1) and (b2), units (b1) are preferred.

Examples of the monomer from which recurring units (b1) are derived are shown below, but not limited thereto. Herein $R^A$ is as defined above.

-continued
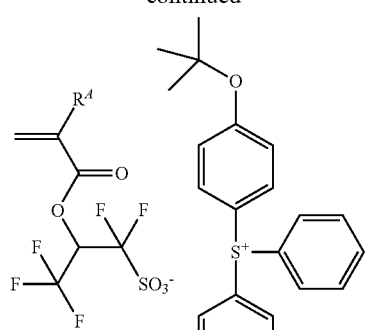
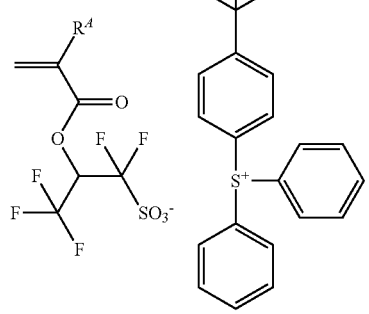
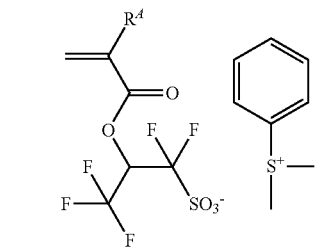
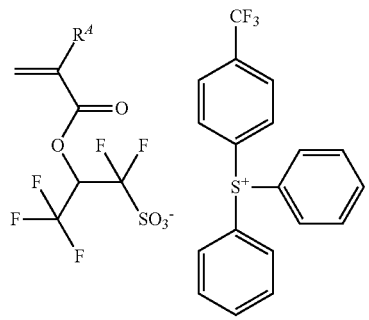
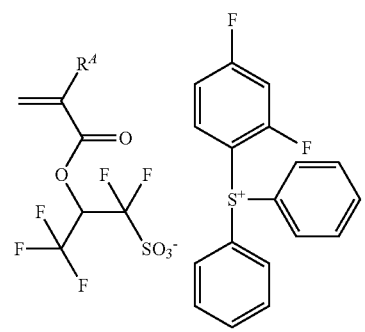
-continued
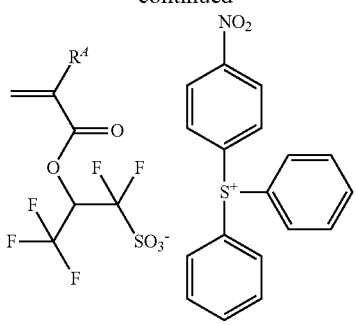
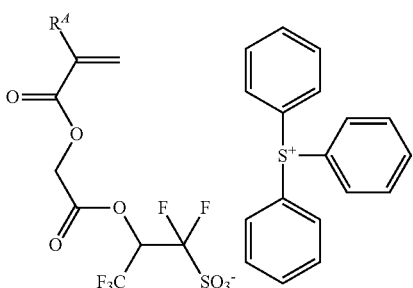
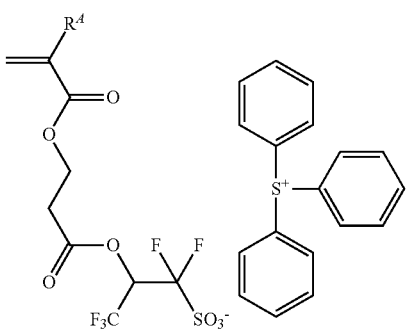
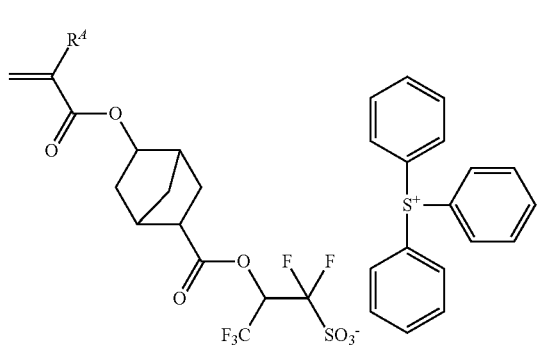
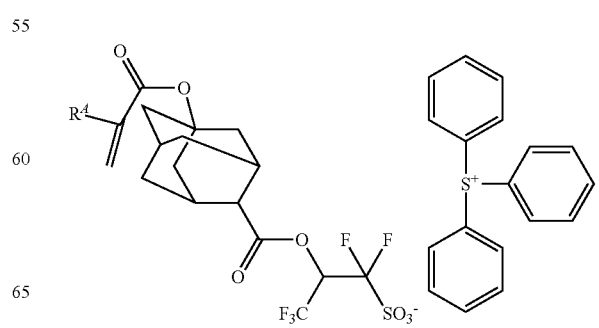

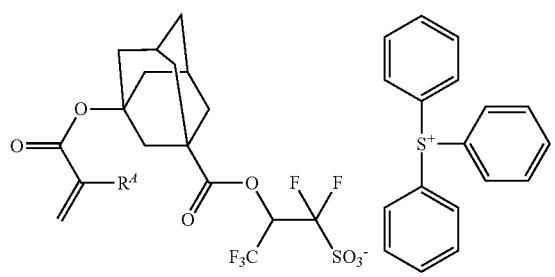
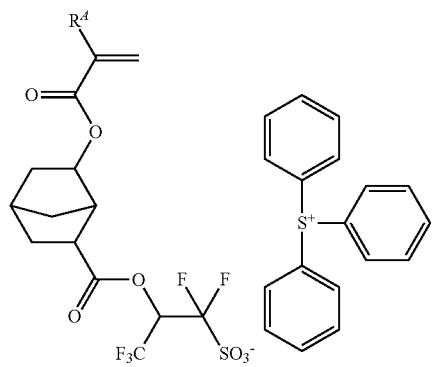
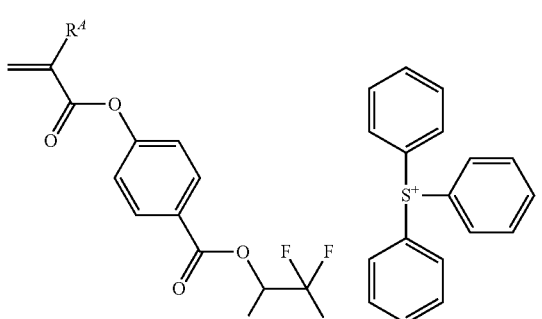
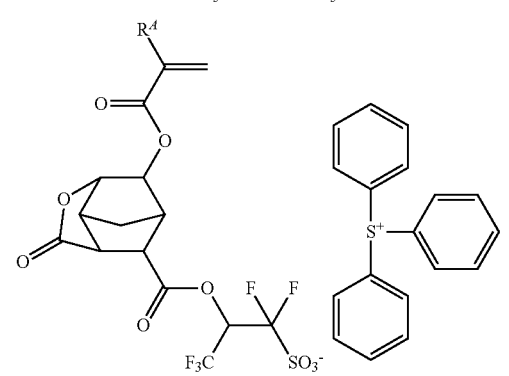
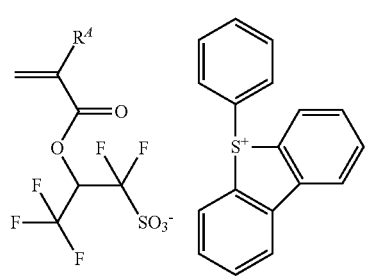
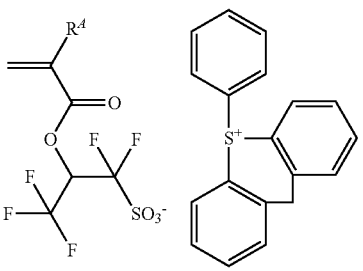
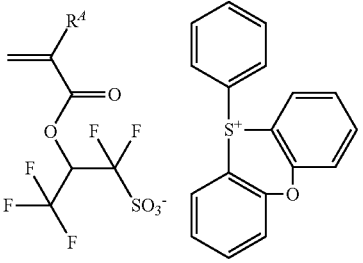
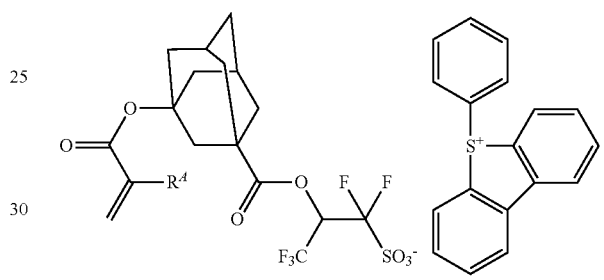
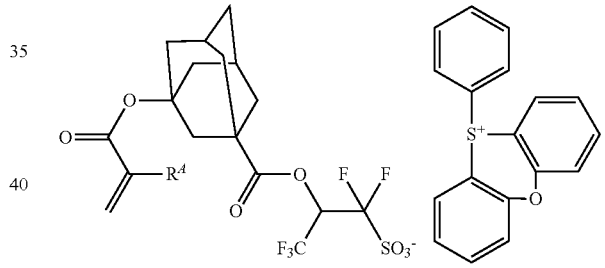
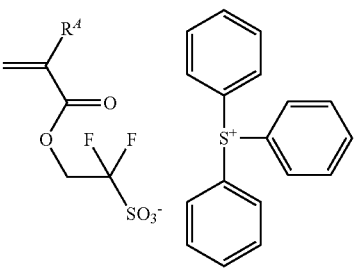
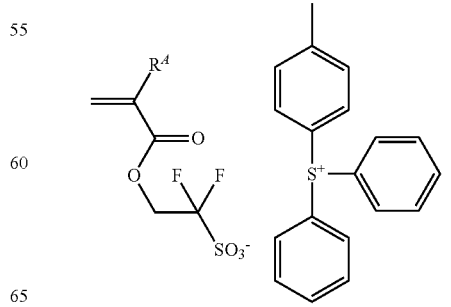

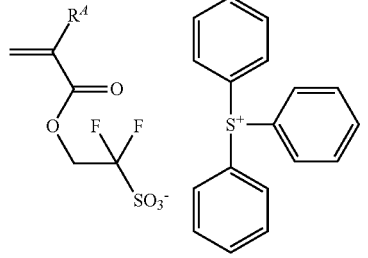
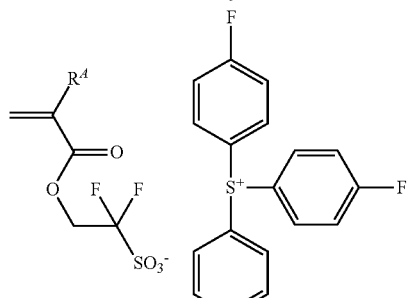
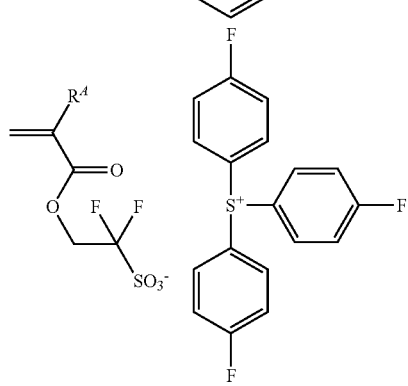
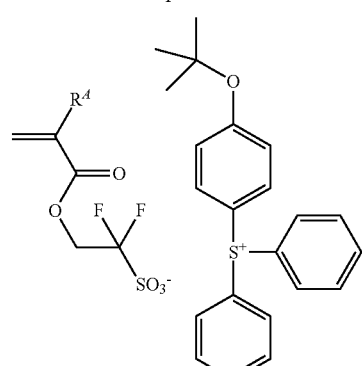
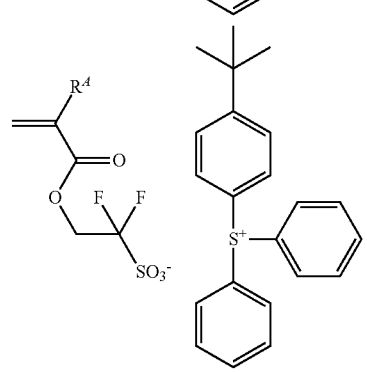
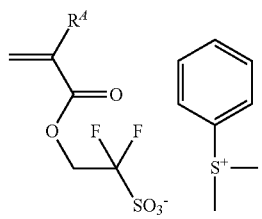
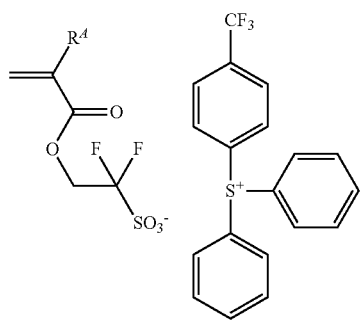
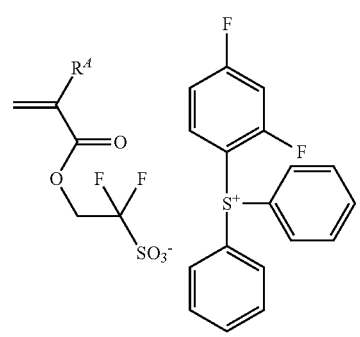
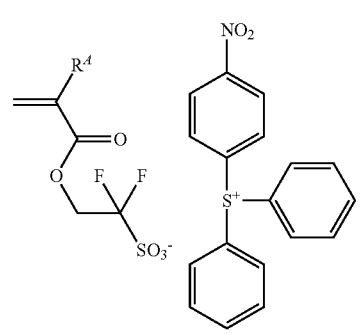
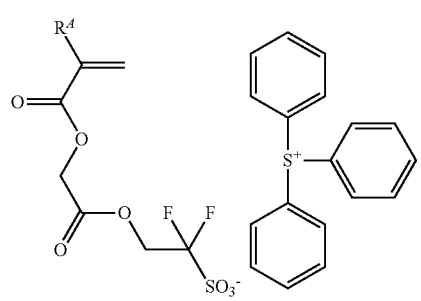

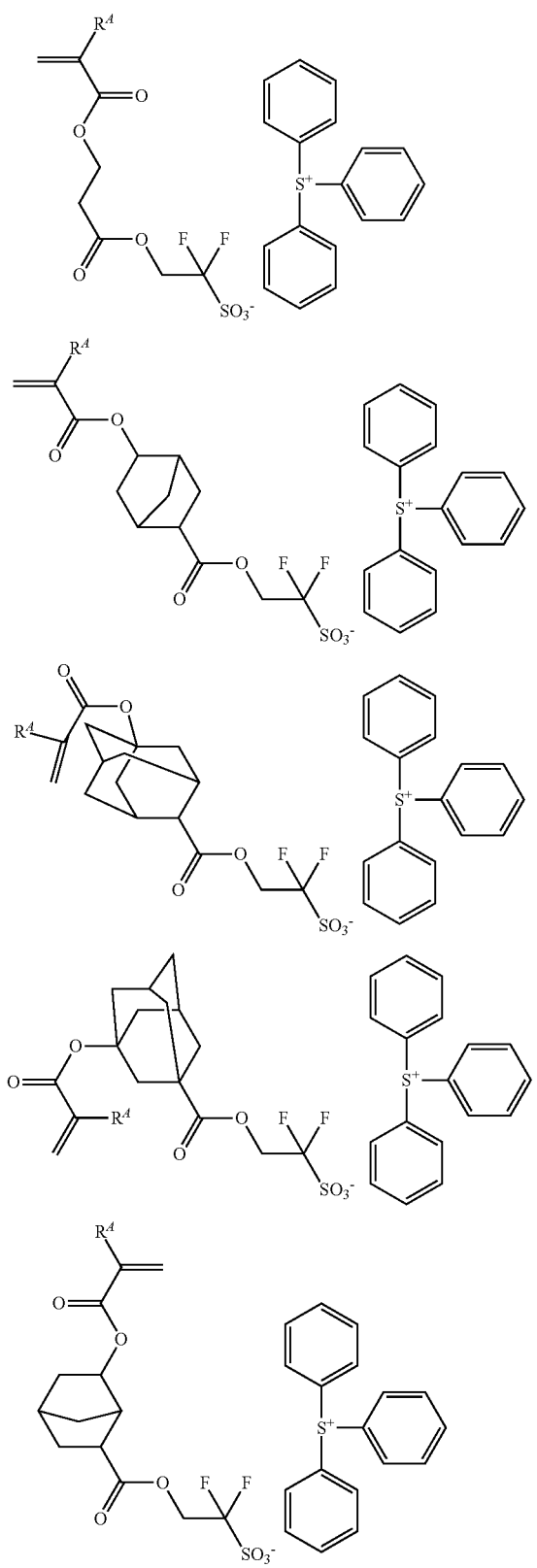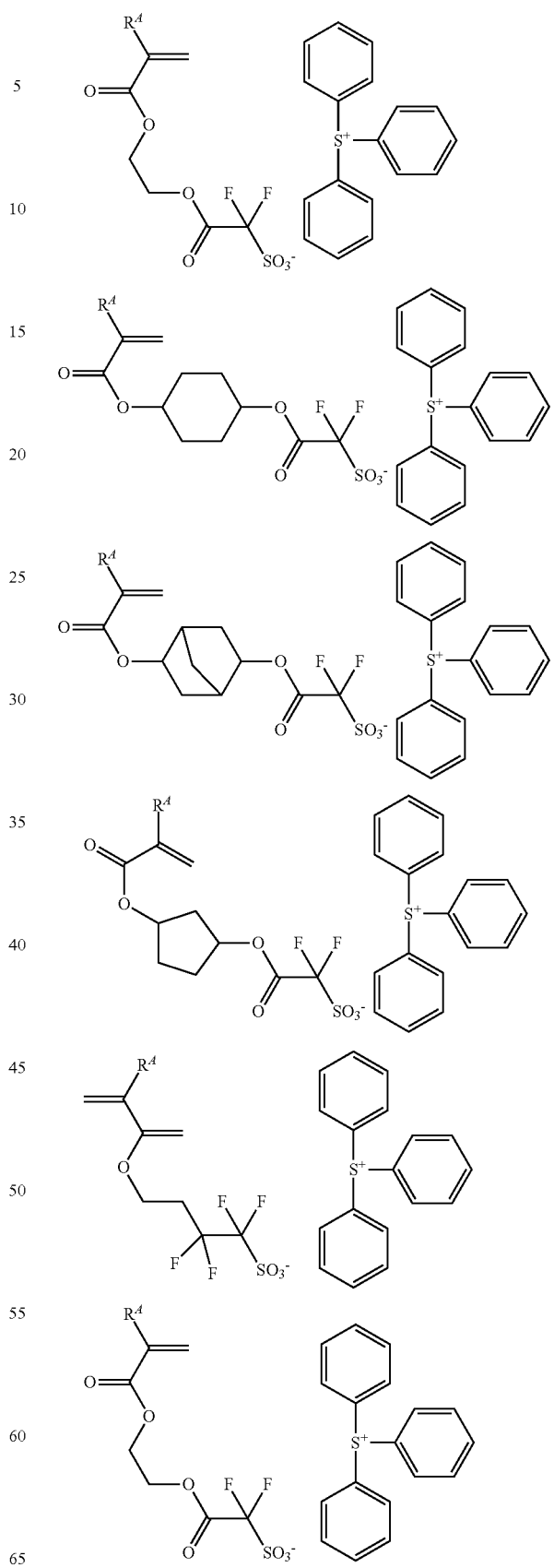
Examples of the monomer from which recurring units (b2) are derived are shown below, but not limited thereto. Herein $R^A$ is as defined above.

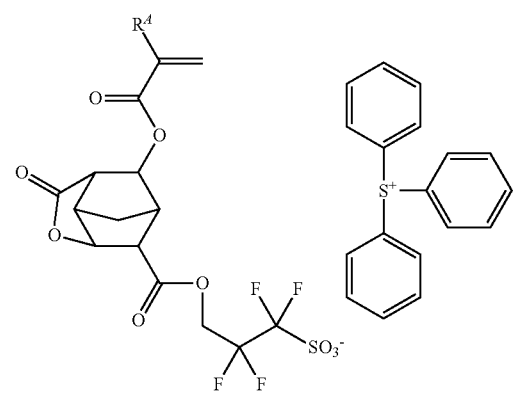
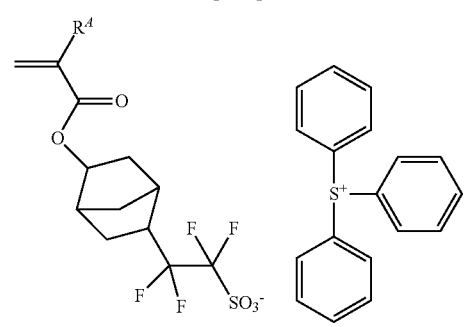
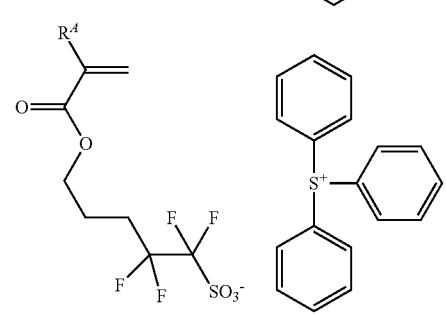
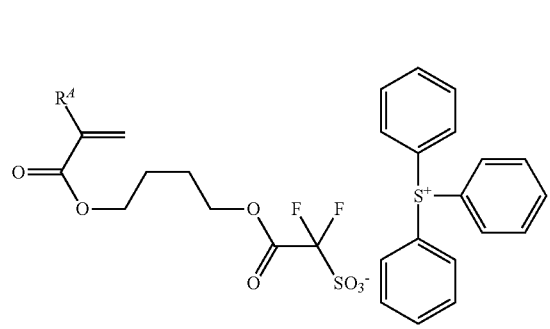
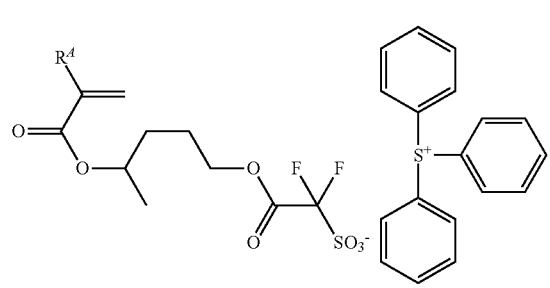

-continued
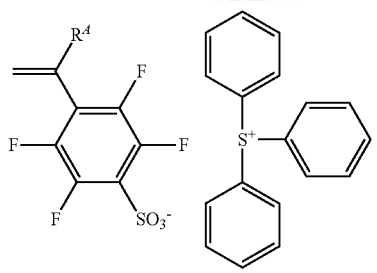
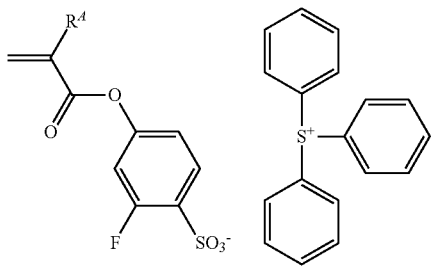
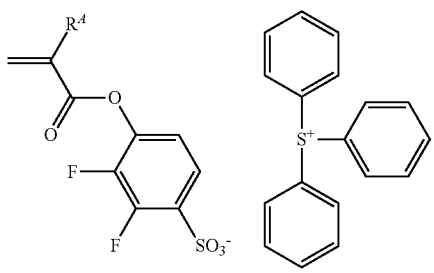
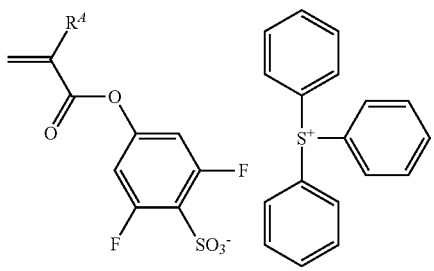
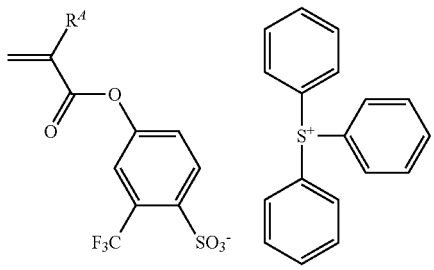
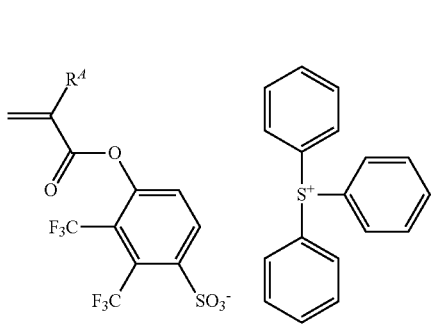
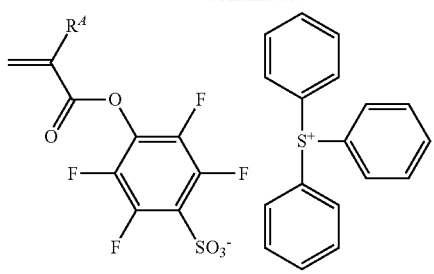
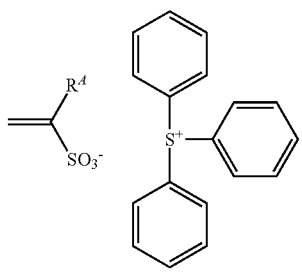
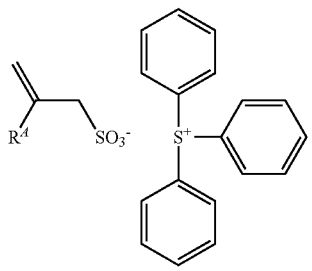
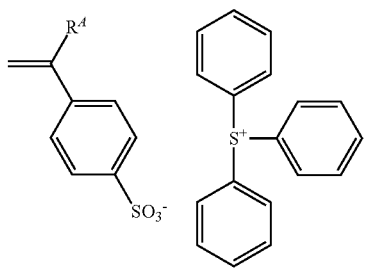
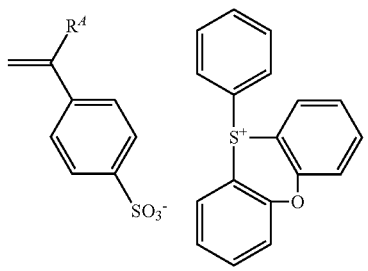

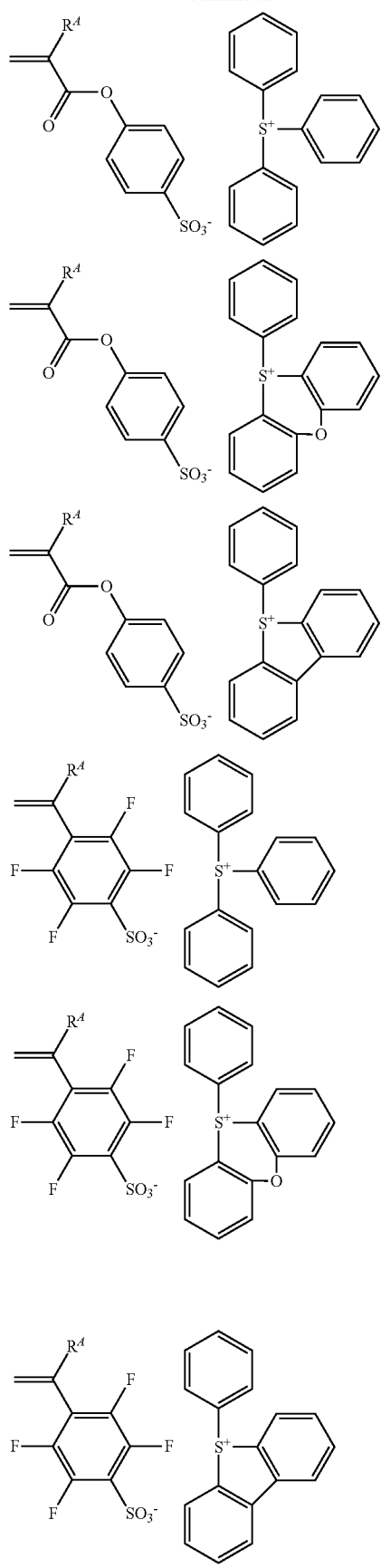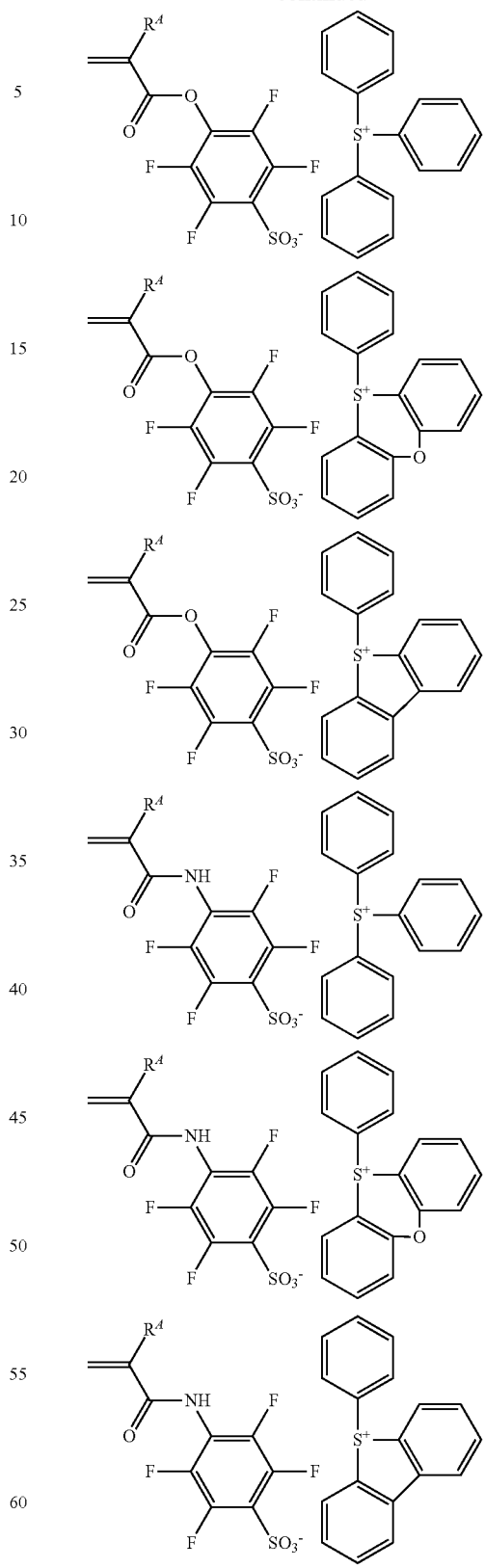
The base resin may further comprise recurring units (c) having a phenolic hydroxyl group as an adhesive group. Examples of suitable monomers from which recurring units (c) are derived are given below, but not limited thereto. Herein $R^A$ is as defined above.
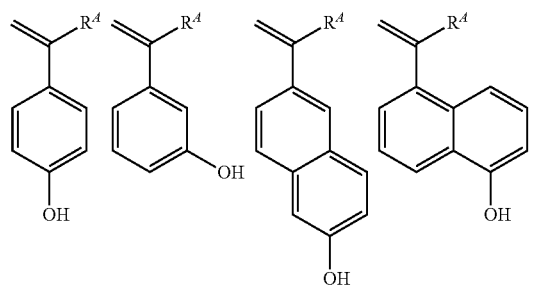
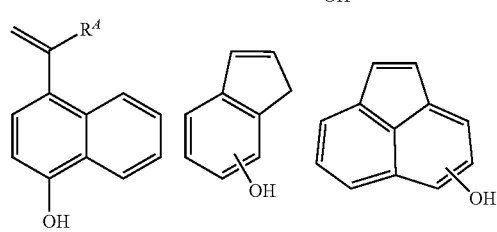
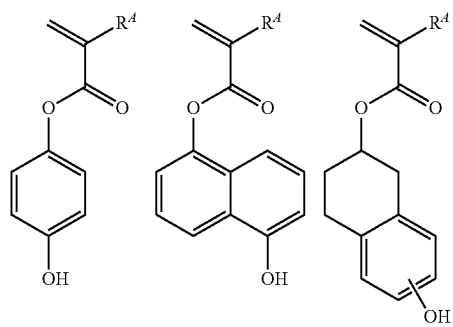
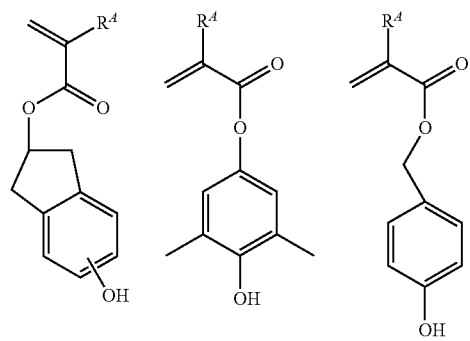
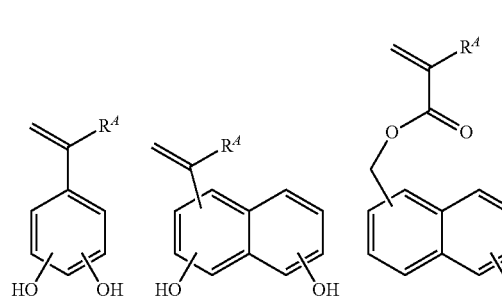
-continued
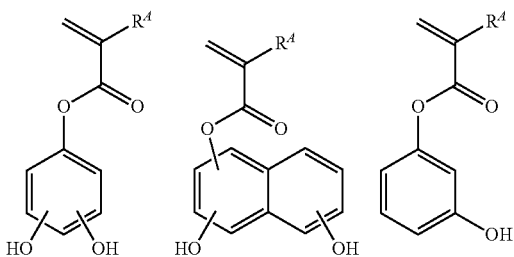
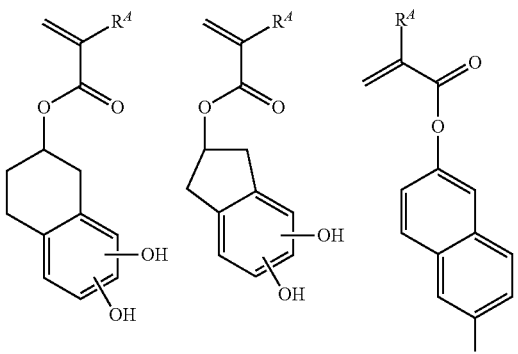
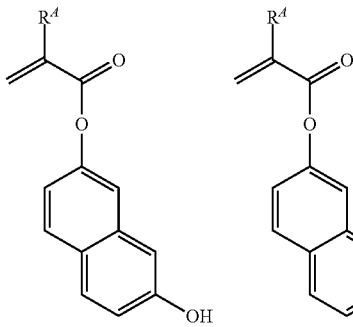
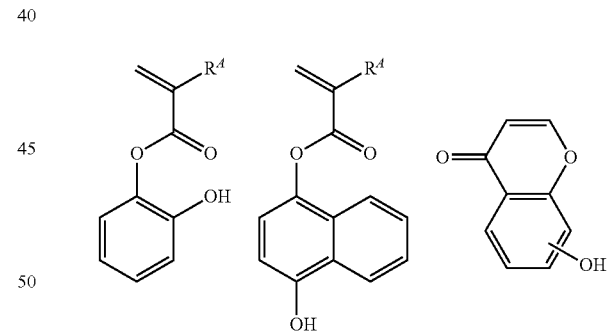
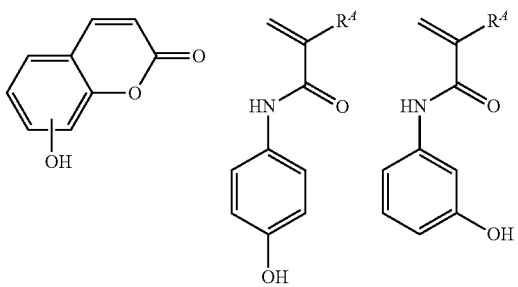

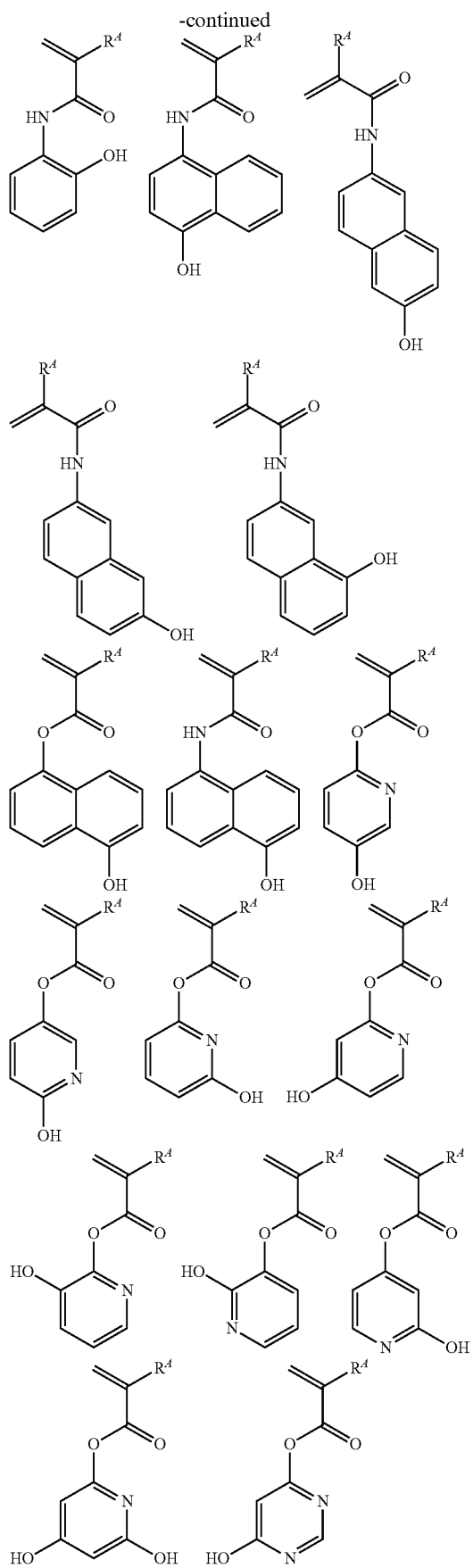
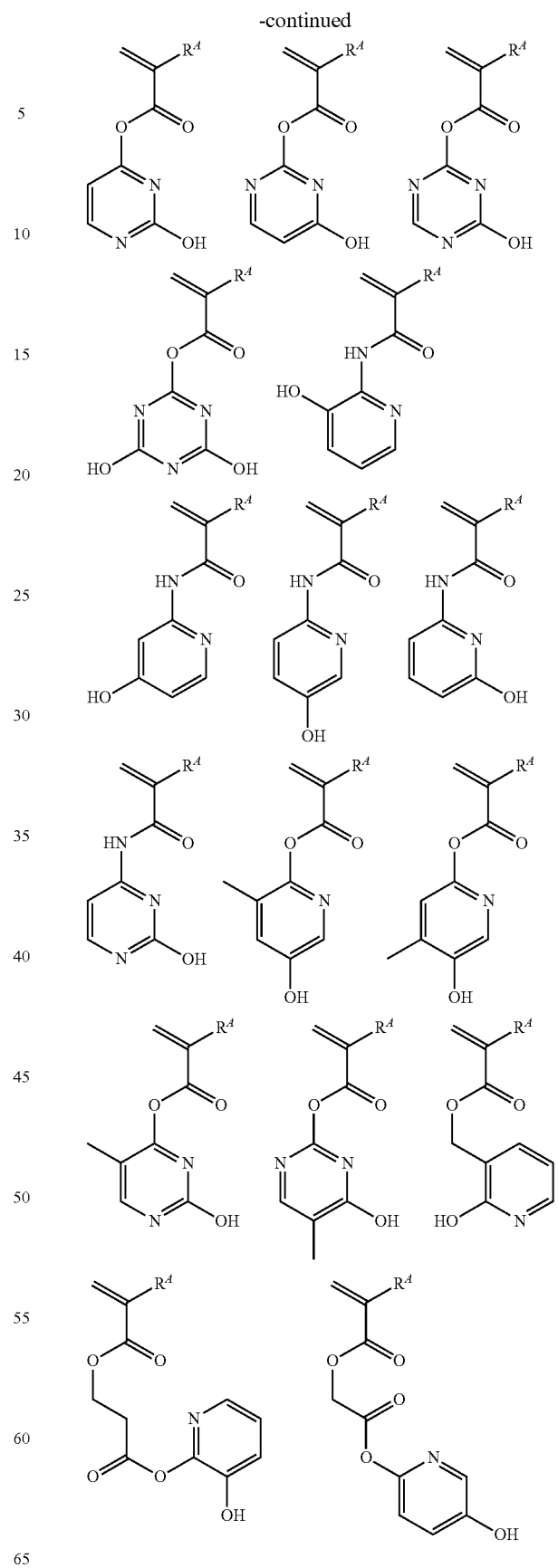

-continued

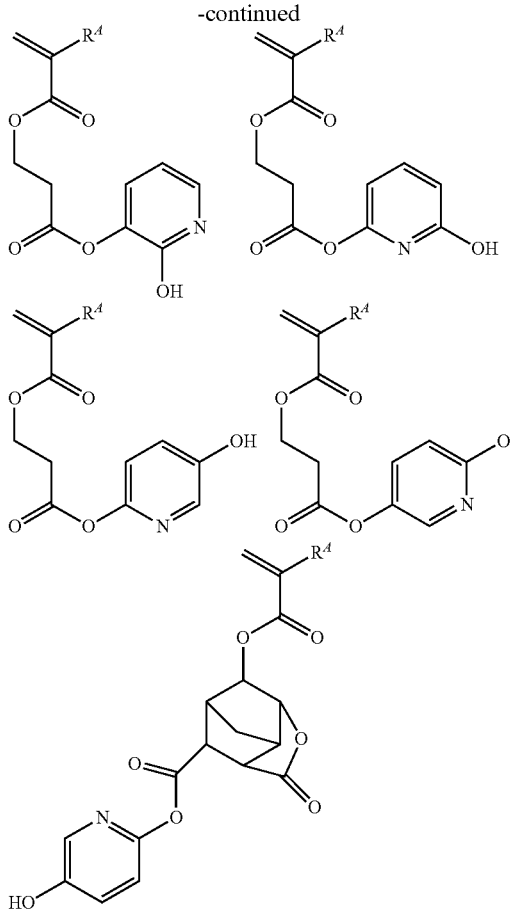

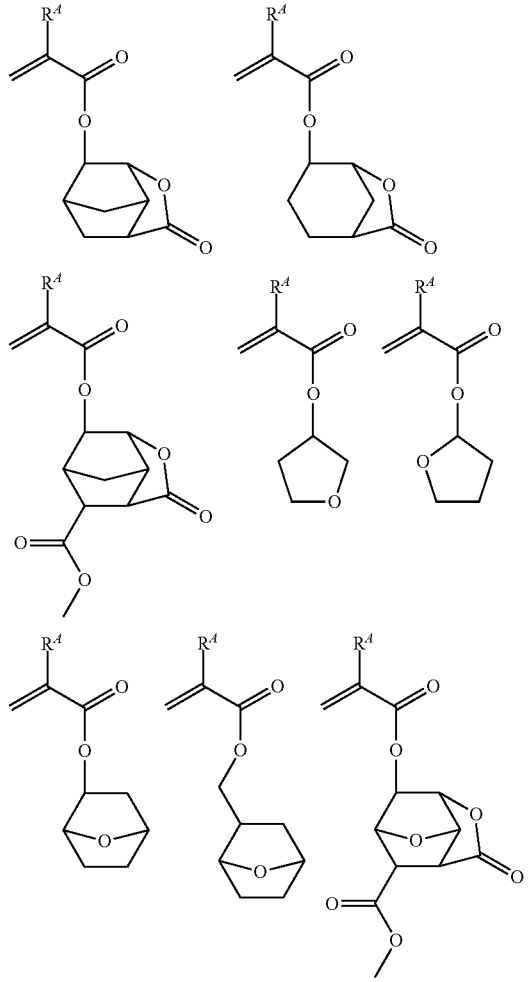

The base resin may further comprise recurring units (d) having another adhesive group selected from hydroxyl group (other than the phenolic hydroxyl), carboxyl group, lactone ring, carbonate bond, thiocarbonate bond, carbonyl group, cyclic acetal group, ether bond, ester bond, sulfonic acid ester bond, cyano group, amide group, —O—C(=O)—S—, and —O—C(=O)—NH—.

Examples of suitable monomers from which recurring units (d) are derived are given below, but not limited thereto. Herein $R^A$ is as defined above.

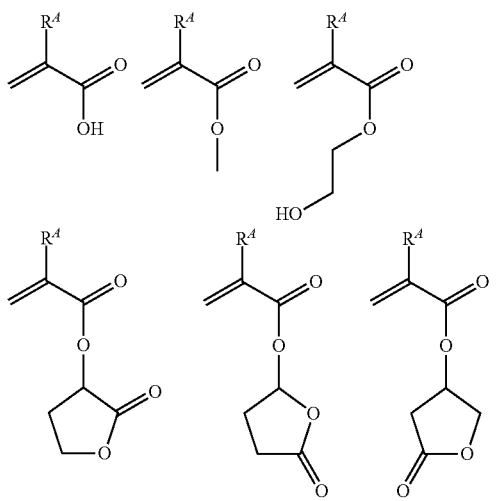

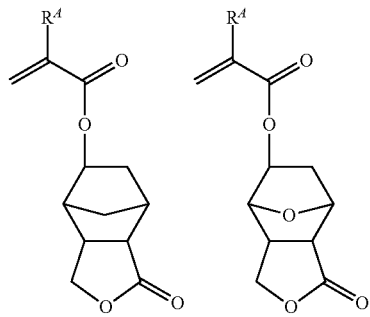

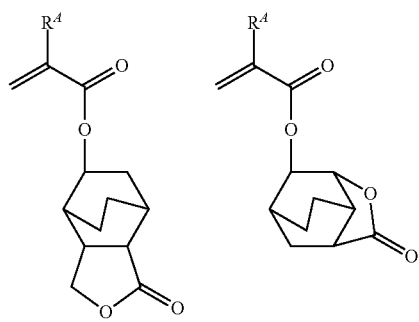

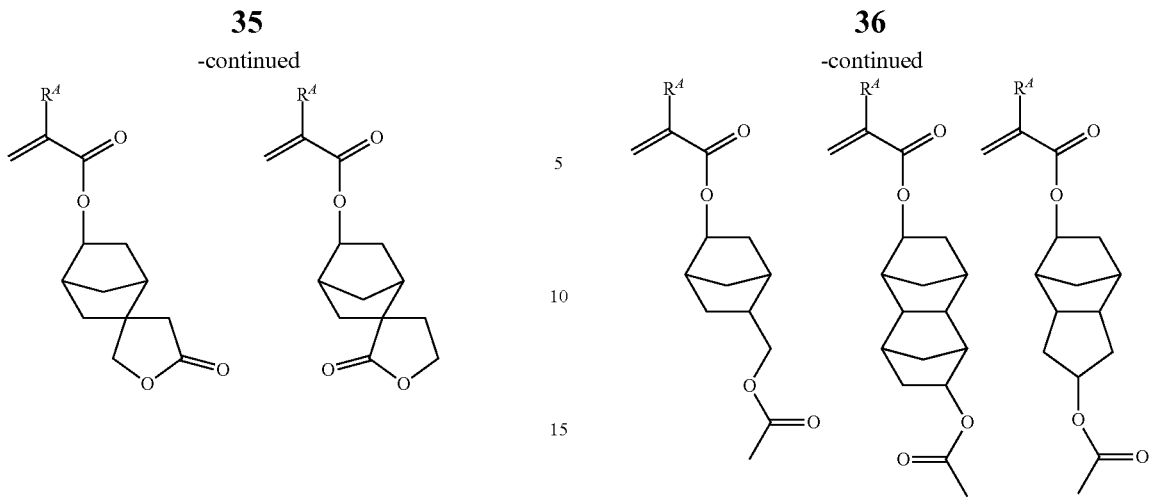
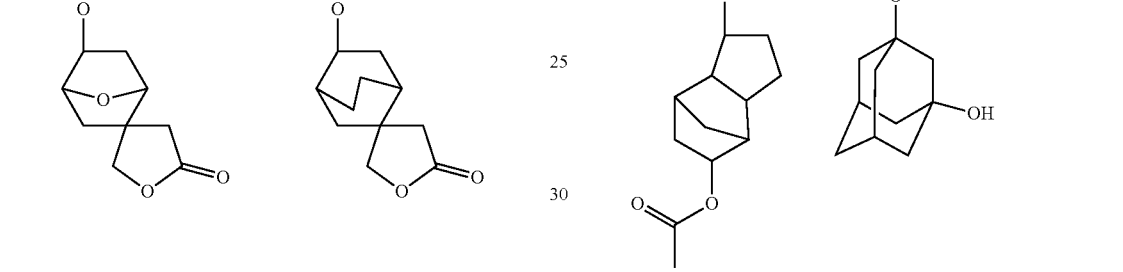
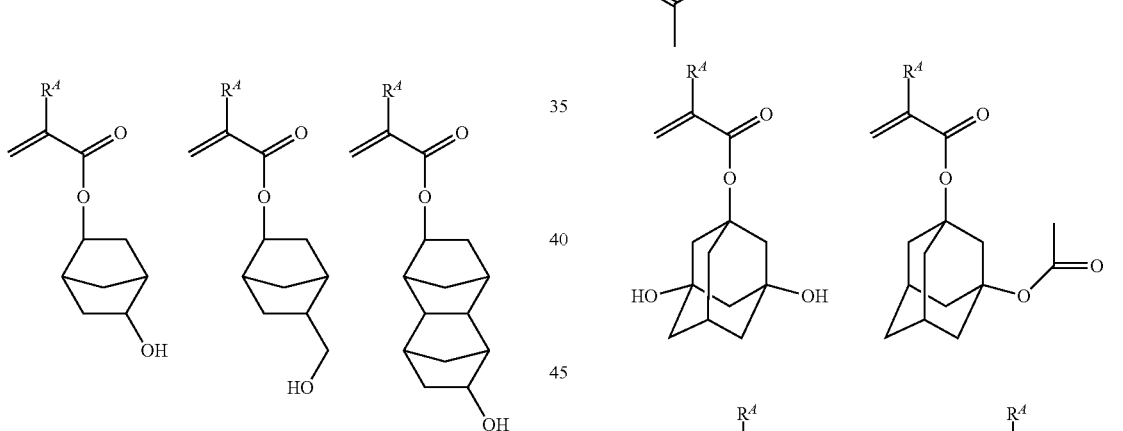
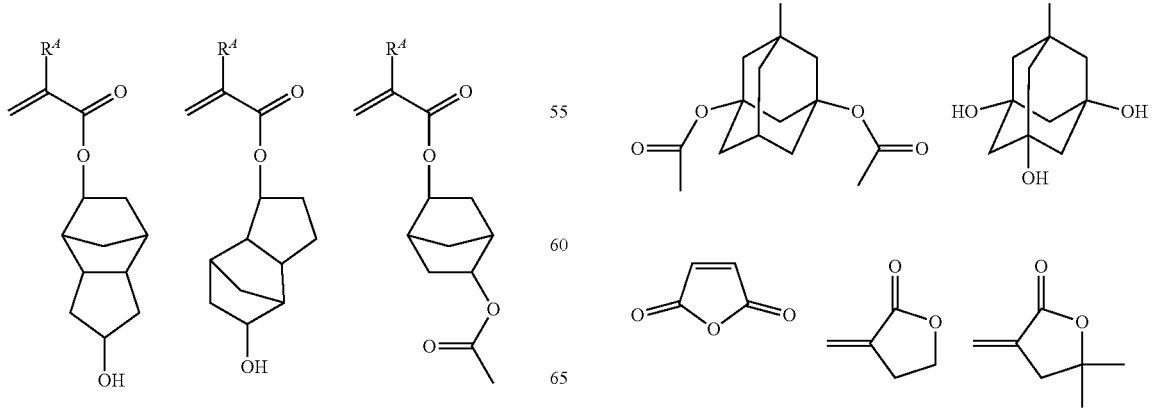
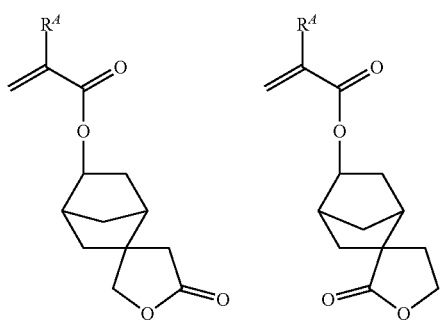
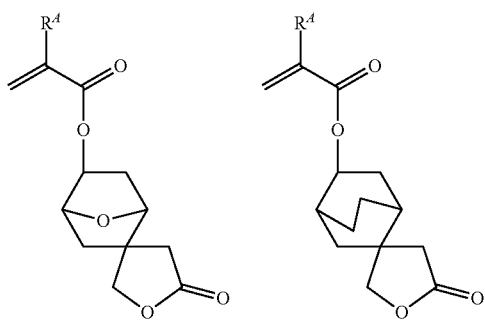
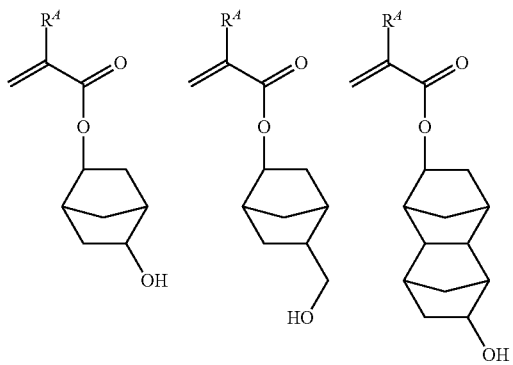
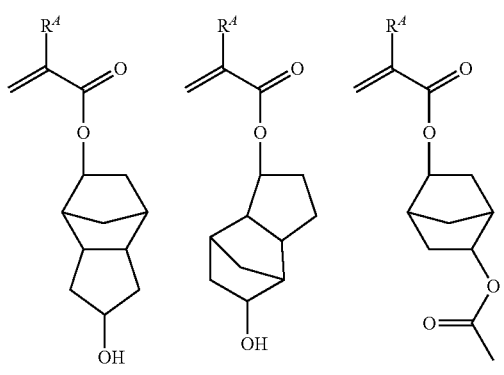

-continued
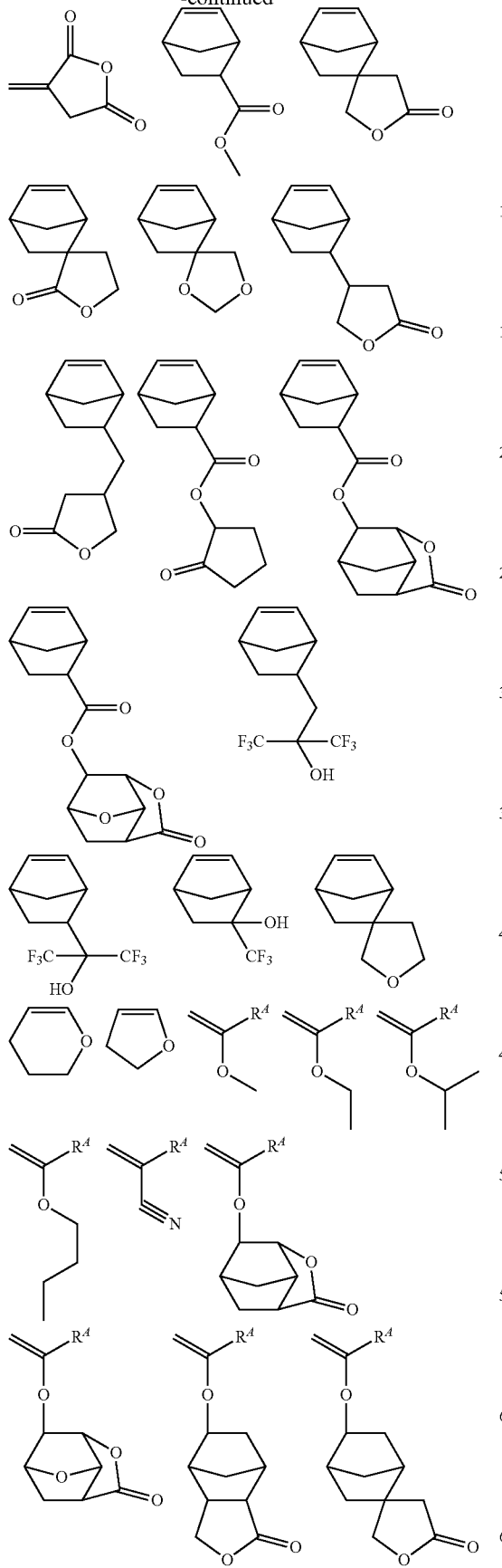
-continued
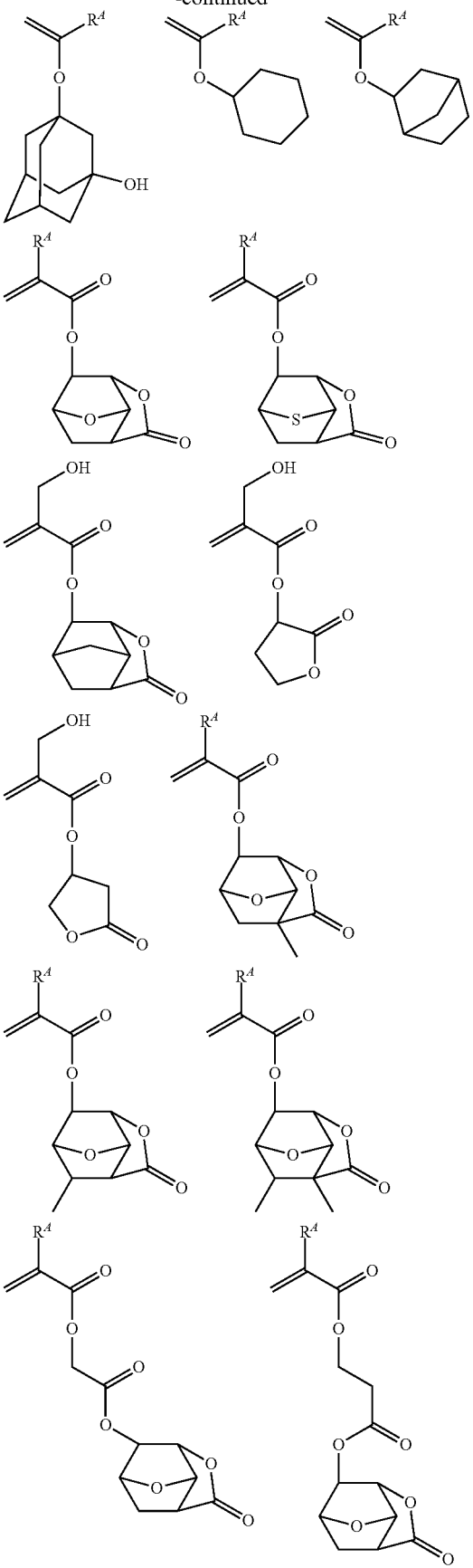

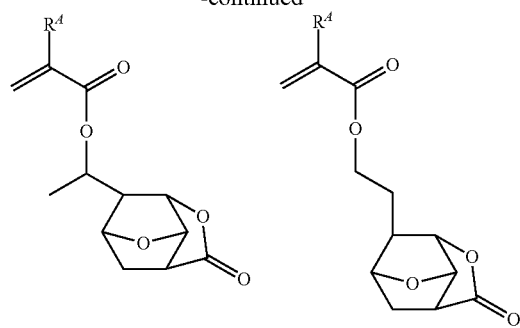
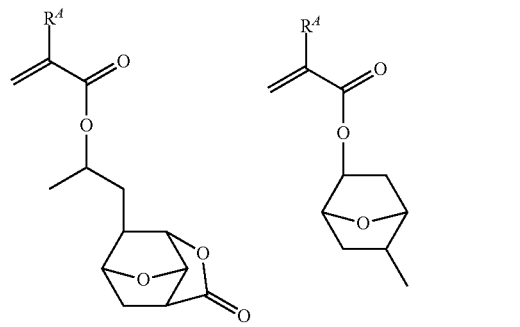
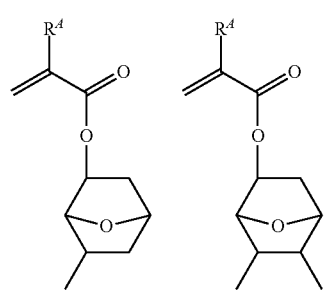
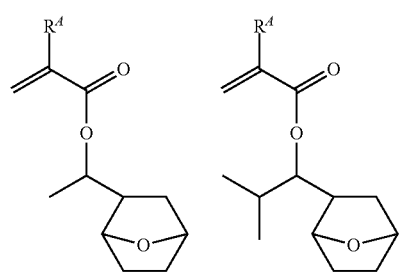
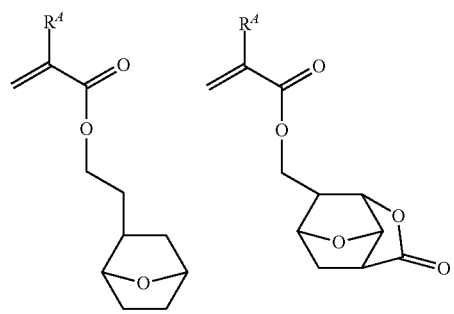
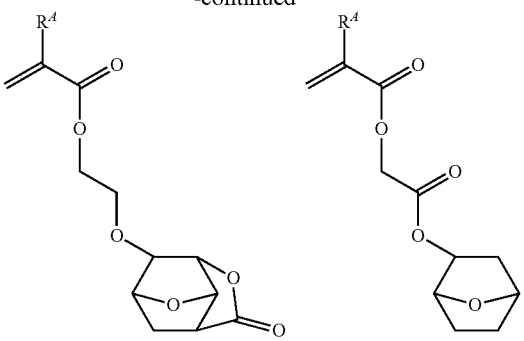
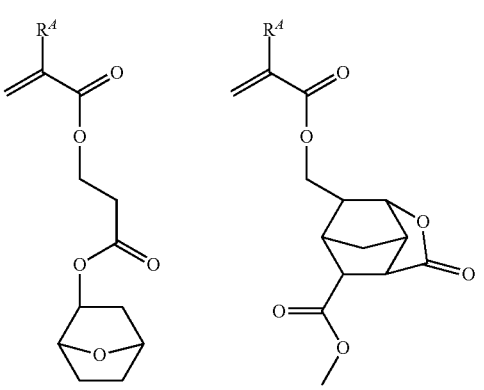
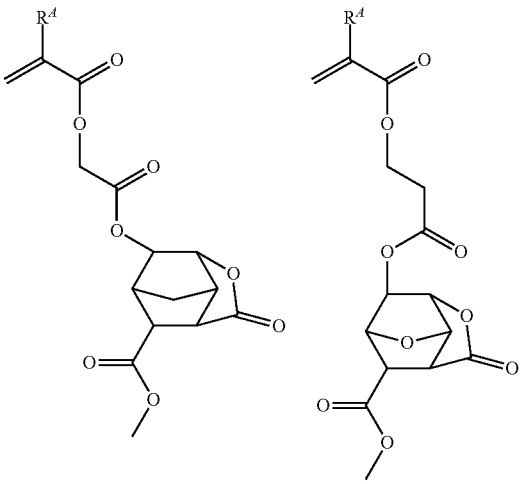
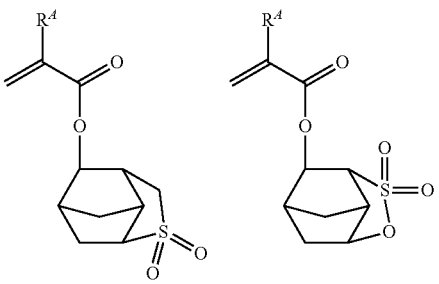

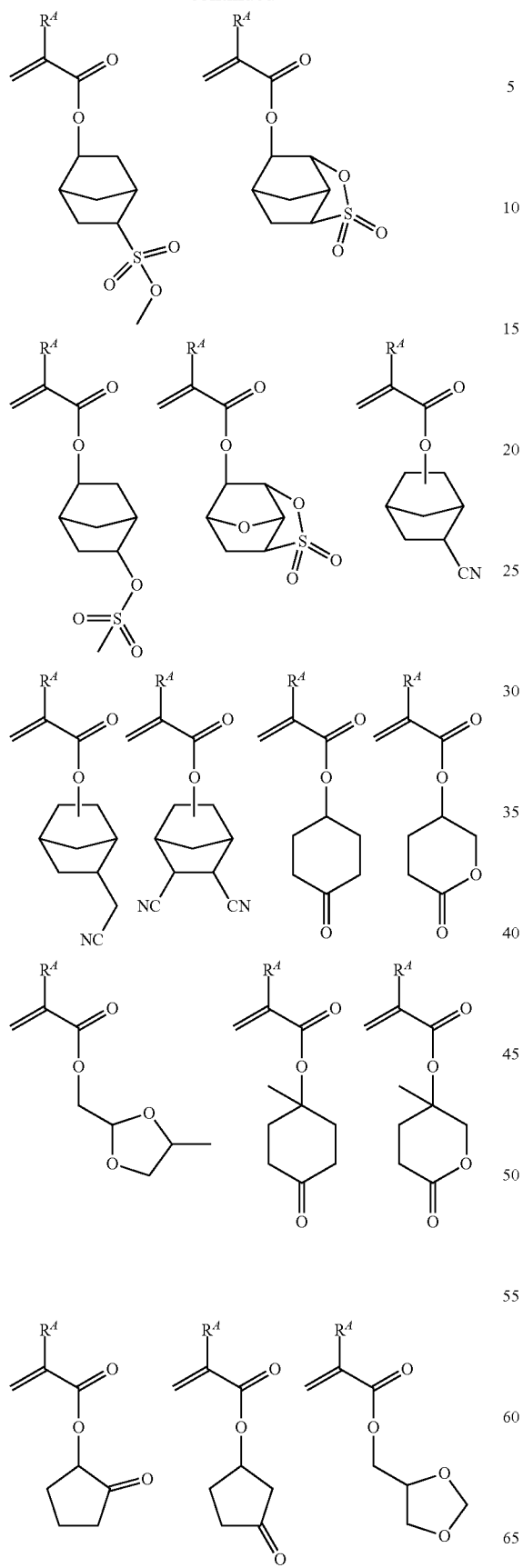
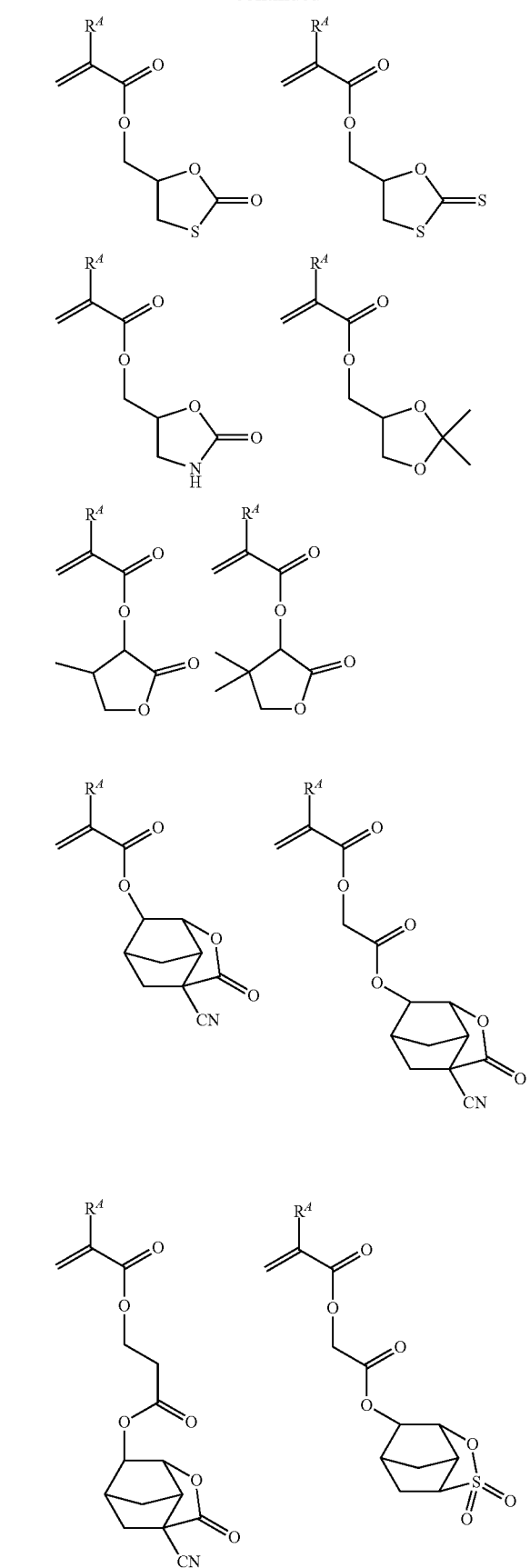

-continued
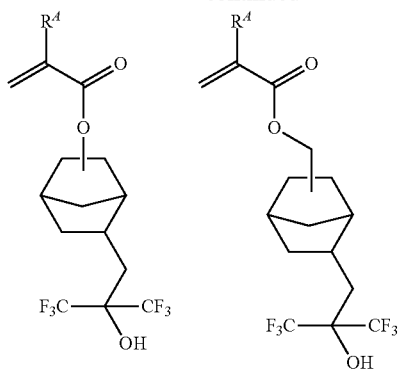
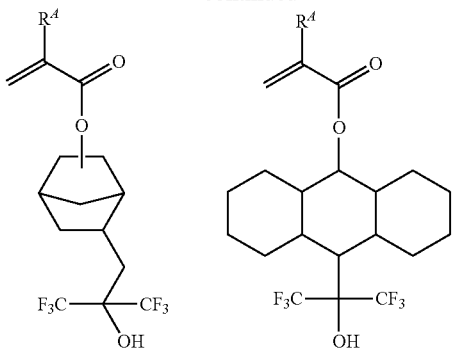
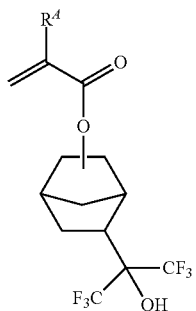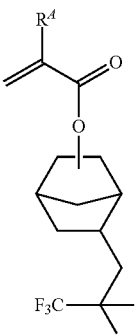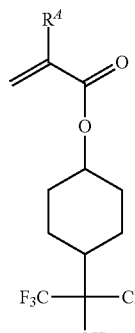
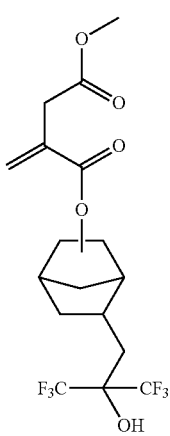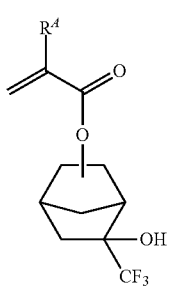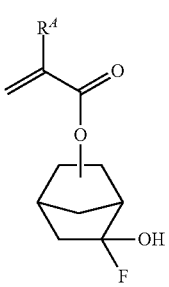
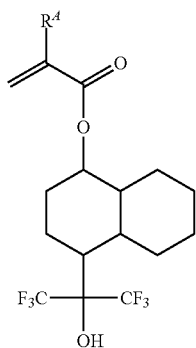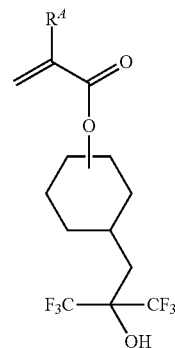
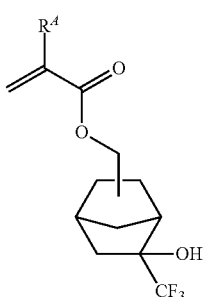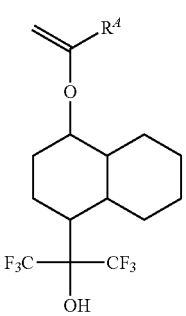
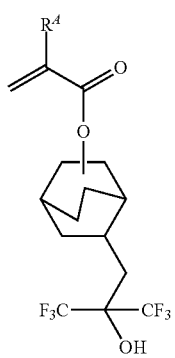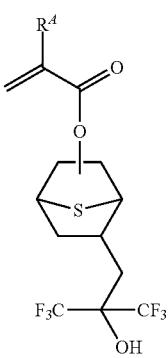
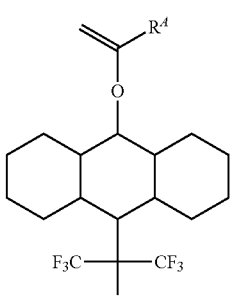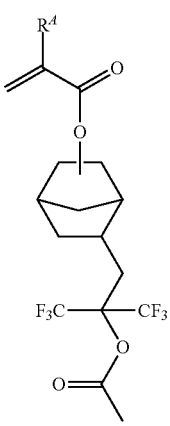

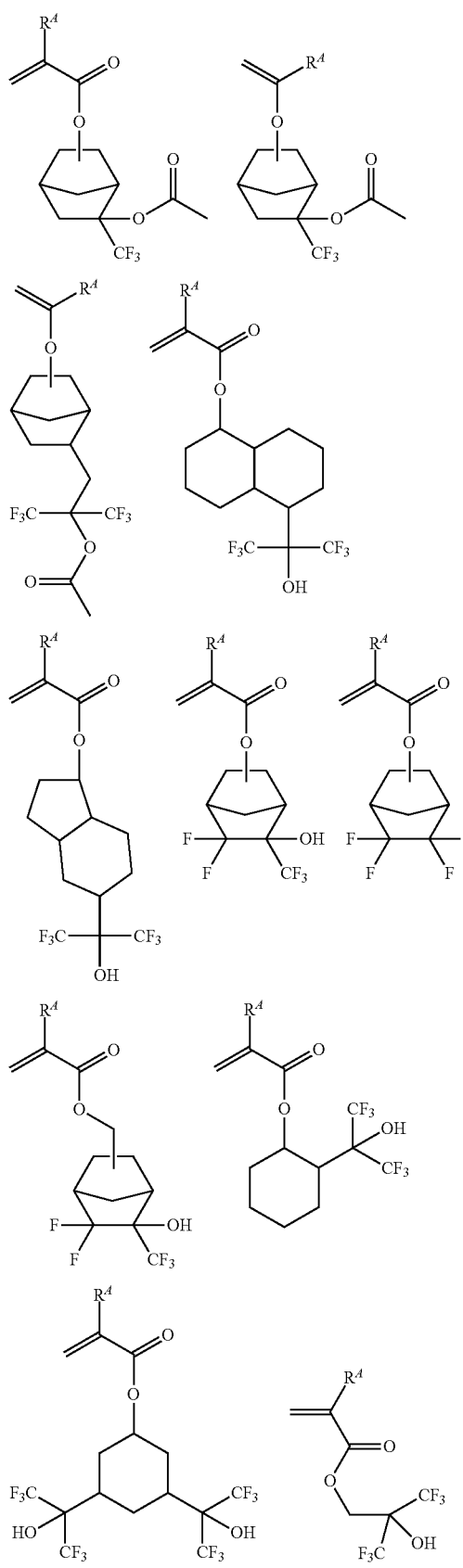
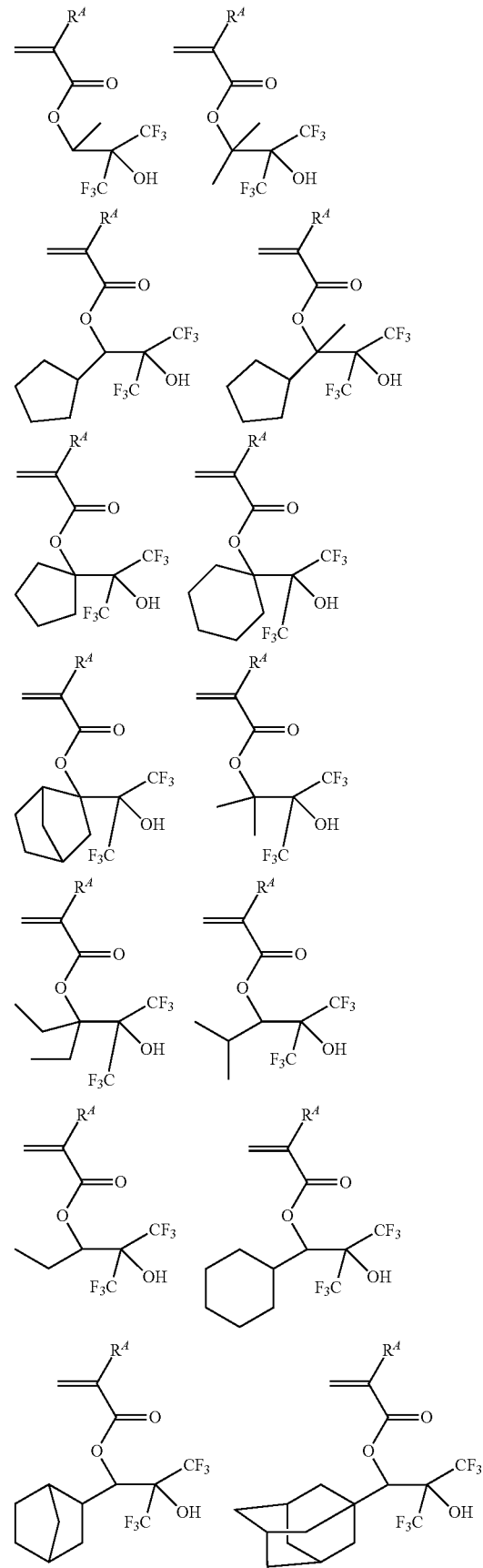

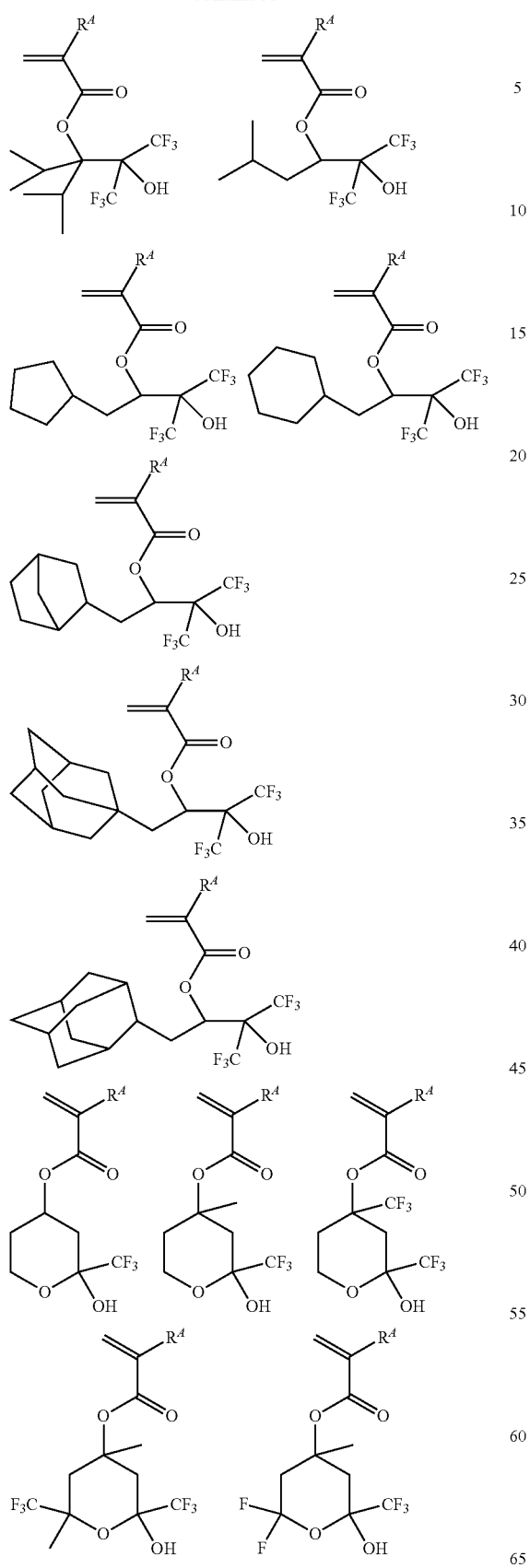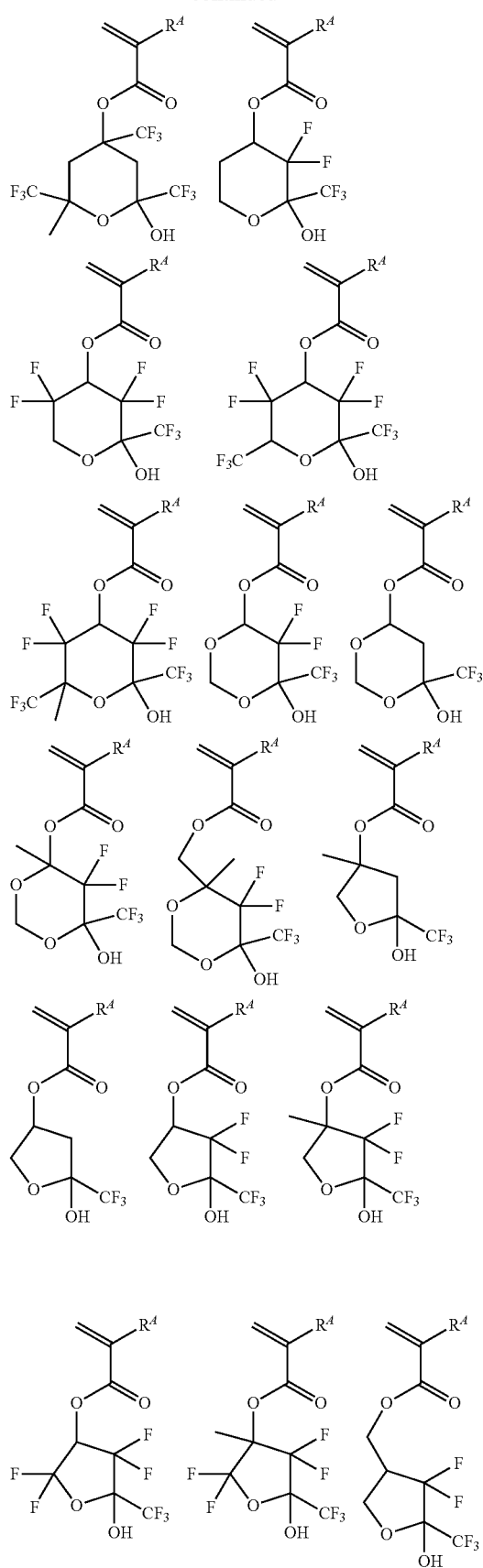

49
-continued
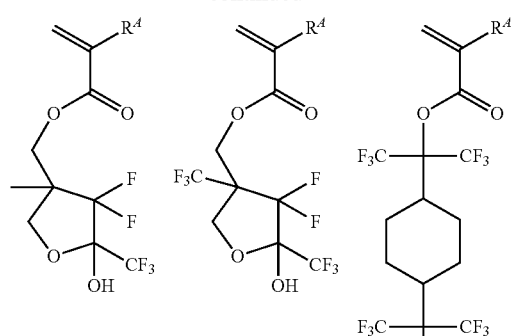
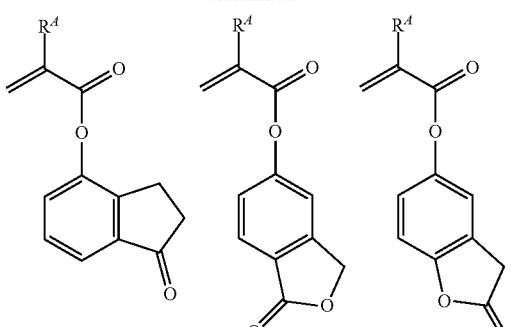
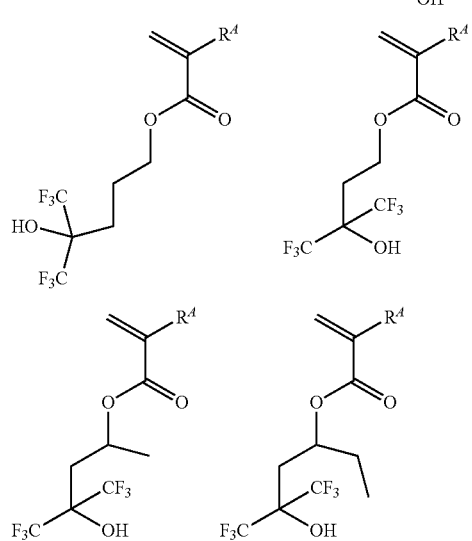
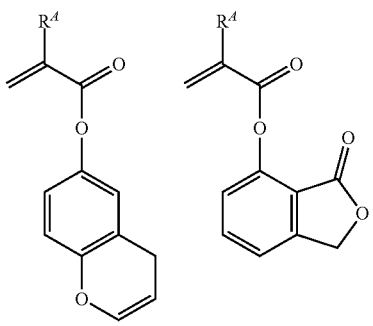
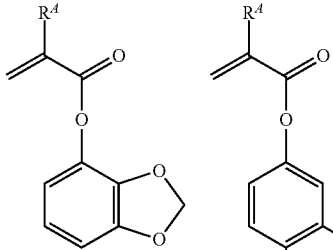
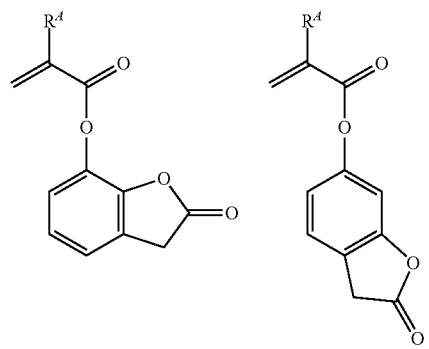
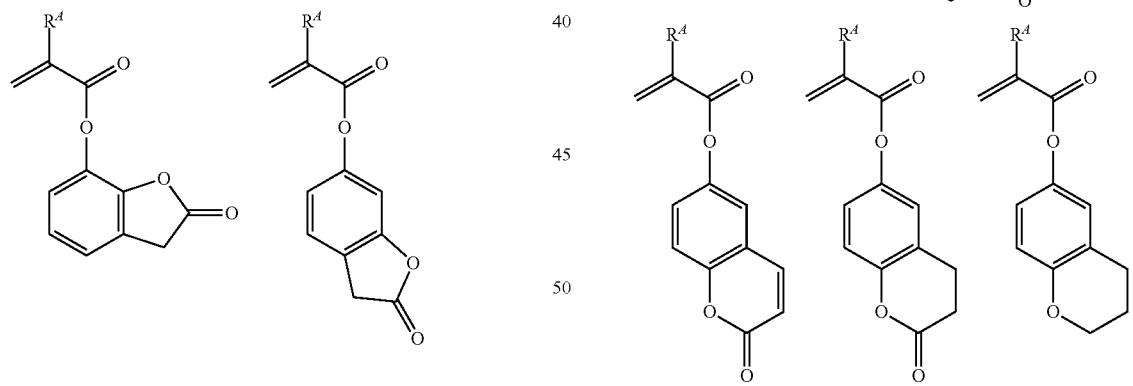
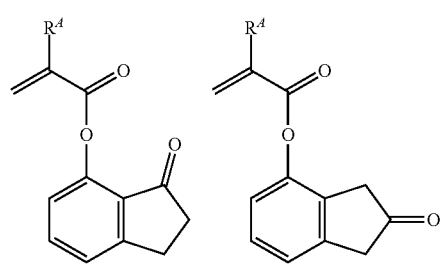
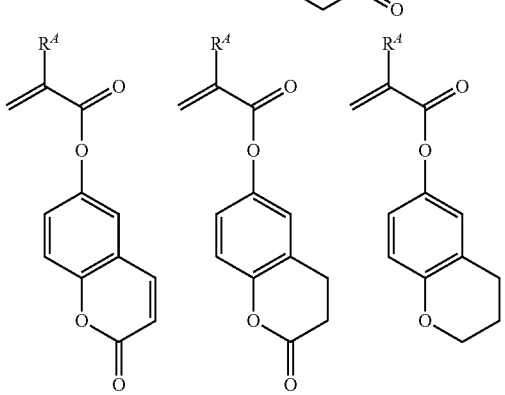
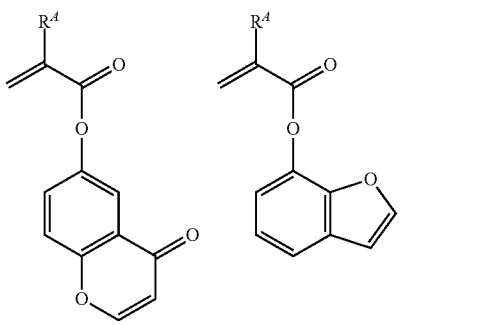
50
-continued

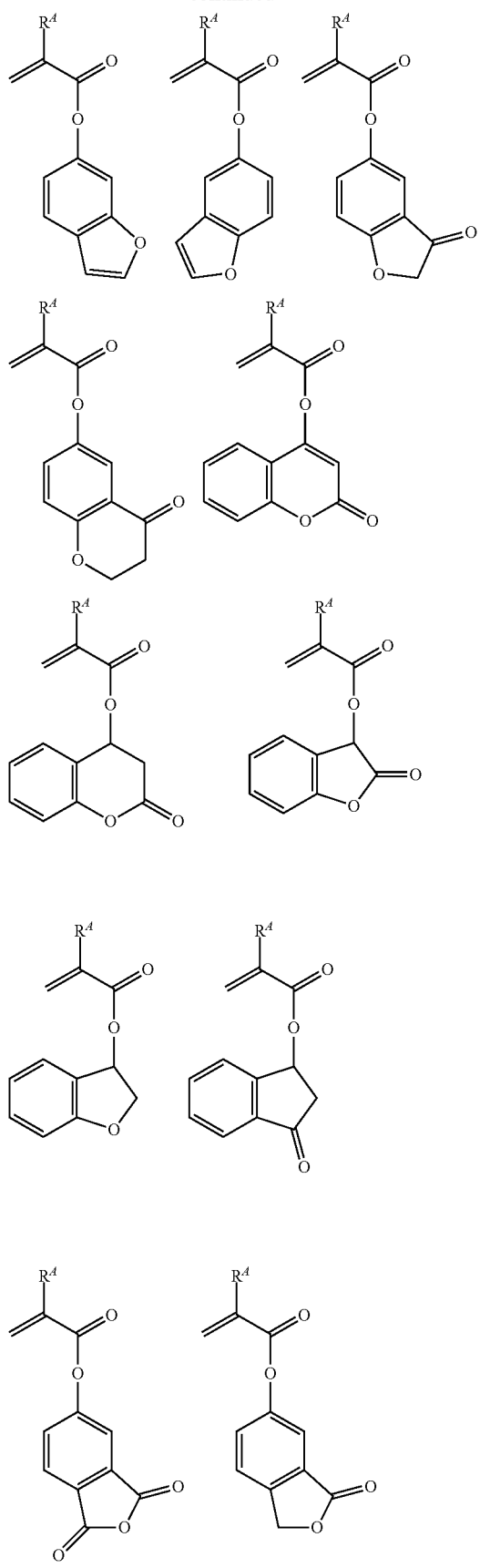
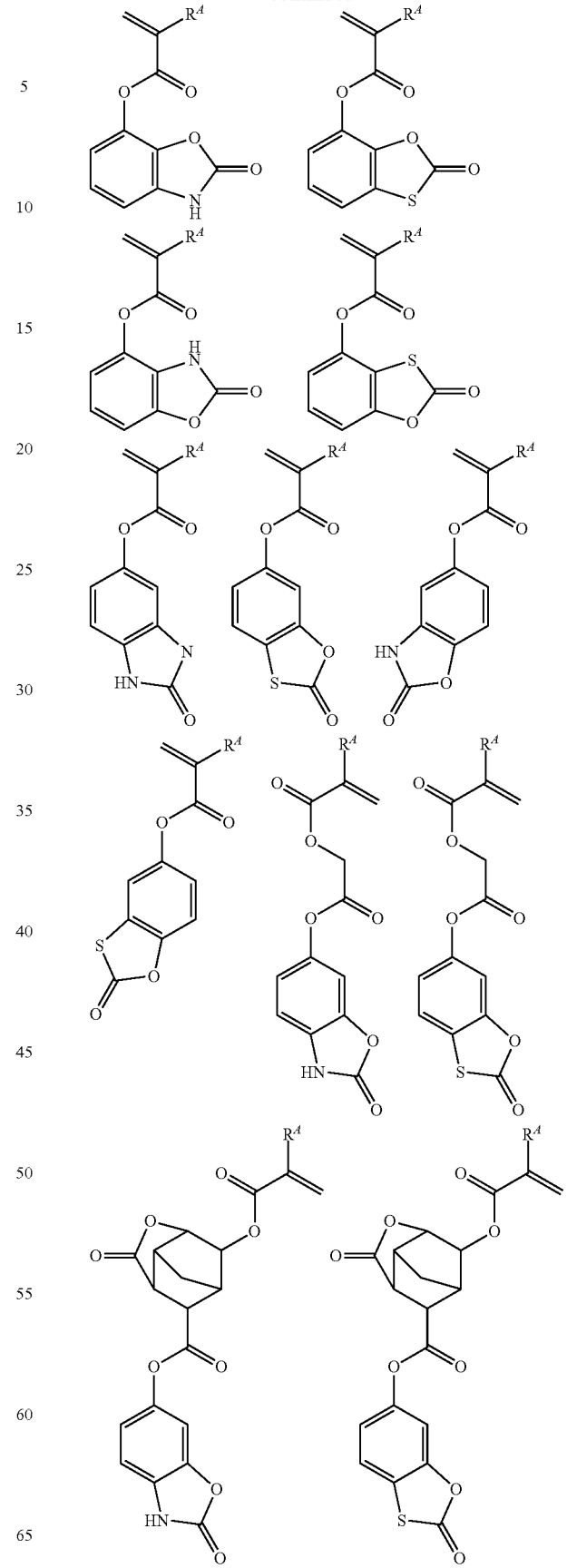

-continued

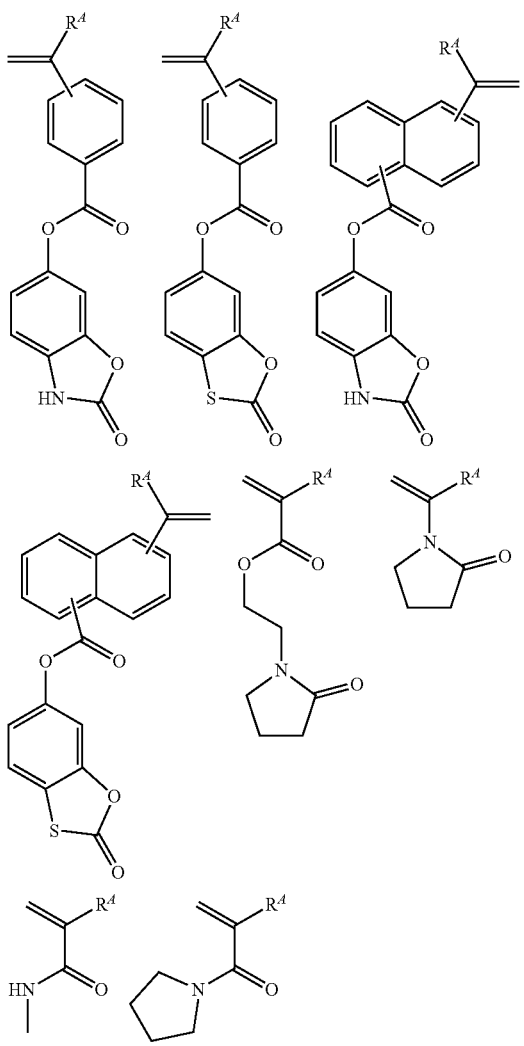
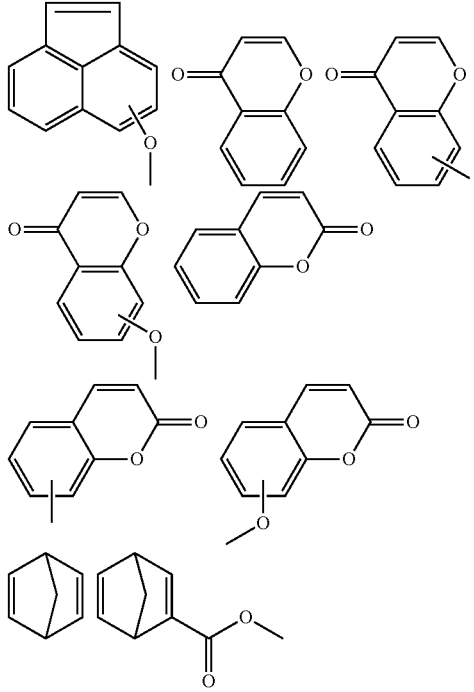

The base resin may further comprise recurring units (e) derived from indene, benzofuran, benzothiophene, acenaphthylene, chromone, coumarin, norbornadiene, or derivatives thereof. Suitable monomers from which recurring units (e) are derived are exemplified below, but not limited thereto.

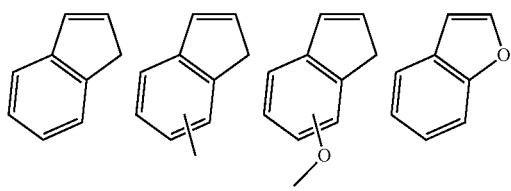

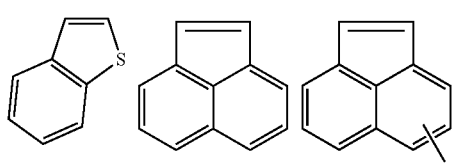

The base resin may further comprise recurring units (f) derived from styrene, vinylnaphthalene, vinylanthracene, vinylpyrene, or methyleneindane.

While the base resin comprises recurring units (a1), (a2), (b1), (b2), (c), (d), (e) and (f), a fraction of these units is preferably $0 \leq a1 < 1.0$, $0 \leq a2 < 1.0$, $0 < a1+a2 < 1.0$, $0 \leq b1 \leq 0.5$, $0 \leq b2 \leq 0.5$, $0 < b1+b2 \leq 0.5$, $0 < a1+a2+b1+b2 \leq 1.0$, $0 \leq c \leq 0.9$, $0 \leq d \leq 0.9$, $0 \leq e \leq 0.9$, and $0 \leq f \leq 0.5$; more preferably $0 \leq a1 \leq 0.8$, $0 \leq a2 \leq 0.8$, $0.1 \leq a1+a2 \leq 0.8$, $0 \leq b1 \leq 0.4$, $0 \leq b2 \leq 0.4$, $0.05 \leq b1+b2 \leq 0.4$, $0 \leq c \leq 0.85$, $0 \leq d \leq 0.85$, $0 \leq e \leq 0.85$, $0 \leq f \leq 0.4$, and $0.15 \leq c+d+e+f \leq 0.85$; even more preferably $0 \leq a1 \leq 0.75$, $0 \leq a2 \leq 0.75$, $0.15 \leq a1+a2 \leq 0.75$, $0 \leq b1 \leq 0.3$, $0 \leq b2 \leq 0.3$, $0.08 \leq b1+b2 \leq 0.3$, $0 \leq c \leq 0.77$, $0 \leq d \leq 0.77$, $0 \leq e \leq 0.77$, $0 \leq f \leq 0.3$, and $0.17 \leq c+d+e+f \leq 0.77$; most preferably $0 \leq a1 \leq 0.7$, $0 \leq a2 \leq 0.7$, $0.15 \leq a1+a2 \leq 0.7$, $0 \leq b1 \leq 0.3$, $0 \leq b2 \leq 0.3$, $0.1 \leq b1+b2 \leq 0.3$, $0 \leq c \leq 0.7$, $0 \leq d \leq 0.7$, $0 \leq e \leq 0.7$, $0 \leq f \leq 0.3$, and $0.2 \leq c+d+e+f \leq 0.75$. Notably, $a1+a2+b1+b2+c+d+e+f=1$.

The base resin may be synthesized by any desired methods, for example, by dissolving one or more monomers selected from the monomers corresponding to recurring units (a1), (a2), (b1), (b2), (c), (d), (e) and (f) in an organic solvent, adding a radical polymerization initiator thereto, and heating for polymerization. Examples of the organic solvent which can be used for polymerization include toluene, benzene, tetrahydrofuran (THF), diethyl ether, and dioxane. Examples of the polymerization initiator used herein include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. Preferably, the reaction temperature is 50 to 80° C., and the reaction time is 2 to 100 hours, more preferably 5 to 20 hours.

In the case of a monomer having a hydroxyl group, the hydroxyl group may be replaced by an acetal group susceptible to deprotection with acid, typically ethoxyethoxy, prior to polymerization, and the polymerization be followed by deprotection with weak acid and water. Alternatively, the hydroxyl group may be replaced by an acetyl, formyl, pivaloyl or similar group prior to polymerization, and the polymerization be followed by alkaline hydrolysis.

When a polymer comprising recurring units derived from hydroxystyrene or hydroxyvinylnaphthalene is synthesized, acetoxystyrene or acetoxyvinylnaphthalene is used instead of hydroxystyrene or hydroxyvinylnaphthalene. After polymerization, the acetoxy group is deprotected by alkaline hydrolysis, for thereby converting the relevant units to hydroxystyrene or hydroxyvinylnaphthalene units. For alkaline hydrolysis, a base such as aqueous ammonia or triethylamine may be used. Preferably the reaction temperature is −20° C. to 100° C., more preferably 0° C. to 60° C., and the reaction time is 0.2 to 100 hours, more preferably 0.5 to 20 hours.

The base resin should preferably have a weight average molecular weight (Mw) in the range of 1,000 to 500,000, and more preferably 2,000 to 30,000, as measured by GPC versus polystyrene standards using tetrahydrofuran (THF) solvent. A Mw of at least 1,000 ensures that the resist composition is heat resistant whereas a Mw of up to 500,000 does invite neither a drop of alkaline solubility nor a footing phenomenon after pattern formation.

If a copolymer has a wide molecular weight distribution or dispersity (Mw/Mn), which indicates the presence of lower and higher molecular weight polymer fractions, there is a possibility that foreign matter is left on the pattern or the pattern profile is degraded. The influences of Mw and Mw/Mn become stronger as the pattern rule becomes finer. Therefore, the base resin should preferably have a narrow dispersity (Mw/Mn) of 1.0 to 2.0, especially 1.0 to 1.5, in order to provide a resist composition suitable for micropatterning to a small feature size.

The base resin may be a blend of two or more polymers which differ in compositional ratio, Mw or Mw/Mn.

The base resin is best suited for use in positive resist compositions. The base resin may be blended with an organic solvent, dissolution inhibitor, additive acid generator, quencher, surfactant, acetylene alcohol and other components in accordance with the intended application, to formulate a positive resist composition.

Examples of the organic solvent used herein are described in JP-A 2008-111103, paragraphs [0144]-[0145] (U.S. Pat. No. 7,537,880). Exemplary solvents include ketones such as cyclohexanone and methyl n-pentyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, t-butyl acetate, t-butyl propionate, and propylene glycol mono-t-butyl ether acetate; and lactones such as γ-butyrolactone, which may be used alone or in admixture. The organic solvent is preferably added in an amount of 100 to 10,000 parts, and more preferably 200 to 8,000 parts by weight per 100 parts by weight of the base resin.

Examples of the dissolution inhibitor used herein are described in JP-A 2008-122932, paragraphs [0155]-[0178] (U.S. Pat. No. 7,771,914). Inclusion of a dissolution inhibitor in a positive resist composition may lead to an increased difference in dissolution rate between exposed and unexposed regions and a further improvement in resolution. If used, the dissolution inhibitor is preferably added in an amount of 0.5 to 50 parts, more preferably 1 to 30 parts by weight per 100 parts by weight of the base resin.

Typical of the additive acid generator is an additive photoacid generator (PAG). The PAG is not particularly limited as long as it is a compound capable of generating an acid upon exposure to high-energy radiation. Suitable PAGs include sulfonium salts, iodonium salts, sulfonyldiazomethane, N-sulfonyloxyimide, and oxime-O-sulfonate acid generators. Exemplary PAGs are described in JP-A 2008-111103, paragraphs [0122]-[0142] (U.S. Pat. No. 7,537,880), JP-A 2009-080474, and JP-A 2015-026064. The acid generators may be used alone or in admixture. If used, the acid generator is preferably added in an amount of 0.1 to 50 parts by weight per 100 parts by weight of the base resin.

The quencher is typically selected from conventional basic compounds. Conventional basic compounds include primary, secondary, and tertiary aliphatic amines, mixed amines, aromatic amines, heterocyclic amines, nitrogen-containing compounds with carboxyl group, nitrogen-containing compounds with sulfonyl group, nitrogen-containing compounds with hydroxyl group, nitrogen-containing compounds with hydroxyphenyl group, alcoholic nitrogen-containing compounds, amide derivatives, imide derivatives, and carbamate derivatives. In particular, the compounds described in JP-A 2008-111103, paragraphs [0146]-[0164] are preferred.

Another useful quencher is an onium salt of carboxylic acid having the formula (1).

$$R^{21}\text{—}CO_2^-M_A^+ \tag{1}$$

Herein $R^{21}$ is a $C_1$-$C_{40}$ monovalent hydrocarbon group which may contain a heteroatom. The monovalent hydrocarbon groups may be straight, branched or cyclic and include $C_1$-$C_{40}$ alkyl groups, $C_2$-$C_{40}$ alkenyl groups, $C_2$-$C_{40}$ alkynyl groups, $C_6$-$C_{40}$ aryl groups, and $C_7$-$C_{40}$ aralkyl groups. Also included are substituted forms of the foregoing groups in which one or more or even all hydrogen is substituted by a hydroxyl, carboxyl, halogen, cyano, amide, nitro, mercapto, sultone, sulfone or sulfonium salt-containing moiety, or in which one or more carbon is substituted by an ether bond, ester bond, carbonyl moiety, carbonate moiety or sulfonic acid ester bond.

$M_A^+$ is an onium cation. Suitable onium cations include sulfonium, iodonium and ammonium cations, with the sulfonium or iodonium cation being preferred.

The preferred anion moiety of the carboxylic acid onium salt has the formula (2).

$$R^{23}\text{—}\underset{\underset{R^{24}}{|}}{\overset{\overset{R^{22}}{|}}{C}}\text{—}CO_2^- \tag{2}$$

Herein $R^{22}$ and $R^{23}$ are each independently hydrogen, fluorine or trifluoromethyl. $R^{24}$ is hydrogen, hydroxyl, or a $C_1$-$C_{35}$ monovalent hydrocarbon group which may contain a heteroatom. The monovalent hydrocarbon groups may be straight, branched or cyclic and include $C_1$-$C_{35}$ alkyl groups, $C_2$-$C_{35}$ alkenyl groups, $C_2$-$C_{35}$ alkynyl groups, $C_6$-$C_{35}$ aryl groups, and $C_7$-$C_{35}$ aralkyl groups. Also included are substituted forms of the foregoing groups in which one or more or even all hydrogen is substituted by a hydroxyl, carboxyl, halogen, cyano, amide, nitro, mercapto, sultone, sulfone or sulfonium salt-containing moiety, or in which one or more carbon is substituted by an ether bond, ester bond, carbonyl moiety, carbonate moiety or sulfonic acid ester bond.

Also useful are quenchers of polymer type as described in U.S. Pat. No. 7,598,016 (JP-A 2008-239918). The polymeric quencher segregates at the resist surface after coating and thus enhances the rectangularity of resist pattern. When a protective film is applied as is often the case in the immersion lithography, the polymeric quencher is also effective for preventing a film thickness loss of resist pattern or rounding of pattern top.

Metal salts as described in U.S. Pat. No. 9,360,753 (JP-A 2013-025211) are also useful as the quencher. Examples include salts of such metals as sodium, magnesium, chromium, manganese, iron, cobalt, nickel, copper, zinc, silver, cadmium, indium, tin, antimony, cesium, zirconium and hafnium with mono- to tetrafunctional $C_1$-$C_{20}$ carboxylic acids, and complexes of the metals with β-diketones.

If used, the quencher is preferably added in an amount of 0.01 to 20 parts, more preferably 0.02 to 15 parts by weight per 100 parts by weight of the base resin. The quenchers may be used alone or in admixture. In the case of a polymeric quencher, it may be added in any desired amount as long as the benefits of the invention are not impaired. Inclusion of the quencher is effective for suppressing the diffusion rate of acid in the resist film and further improving the resolution.

Exemplary surfactants are described in JP-A 2008-111103, paragraphs [0165]-[0166]. Inclusion of a surfactant may improve or control the coating characteristics of the resist composition. The surfactants may be used alone or in admixture. If used, the surfactant is preferably added in an amount of 0.0001 to 10 parts, more preferably 0.001 to 5 parts by weight per 100 parts by weight of the base resin.

Suitable acetylene alcohols are described in JP-A 2008-122932, paragraphs [0179]-[0182]. If used, the acetylene alcohol is preferably added in an amount of 0 to 2%, more preferably 0.02 to 1% by weight of the resist composition.

EXAMPLE

Synthesis Examples, Preparation Examples, and Examples of the invention are given below by way of illustration and not by way of limitation. The abbreviation "pbw" is parts by weight.

Synthesis Example

Synthesis of Base Resins

Base resins (Polymers 1 to 11, Comparative Polymers 1 to 3) were synthesized by combining suitable monomers, effecting copolymerization reaction in THF, crystallizing from methanol, repeatedly washing with hexane, isolation, and drying. The resins were analyzed for composition by $^1$H-NMR spectroscopy and for Mw and Mw/Mn by GPC versus polystyrene standards using THF solvent.

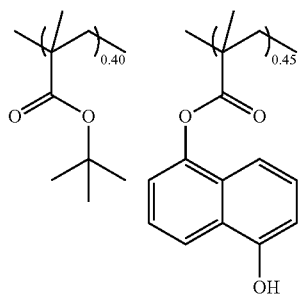

Polymer 1

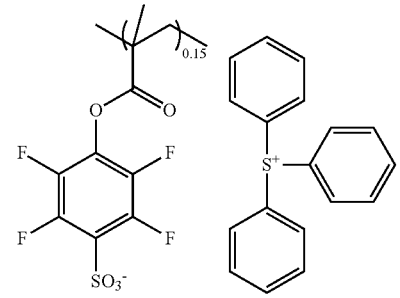

Mw = 7,900
Mw/Mn = 1.97

Polymer 2

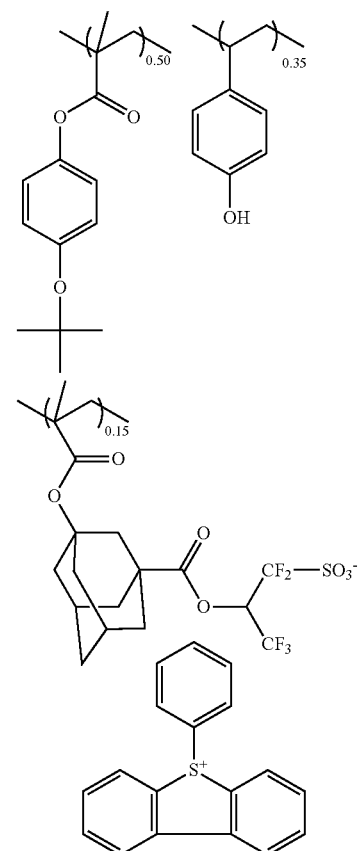

Mw = 8,300
Mw/Mn = 1.98

Polymer 3

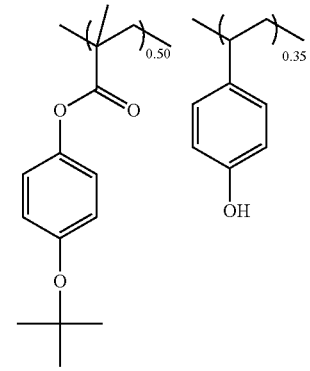

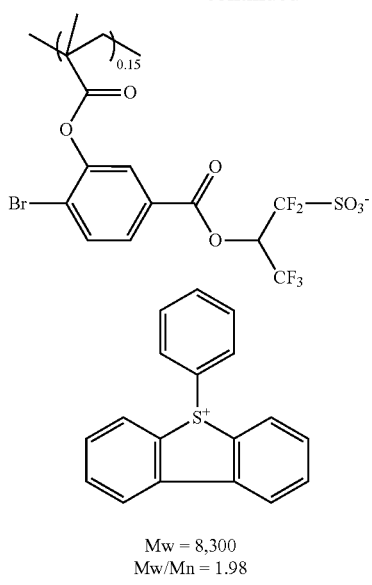
Mw = 8,300
Mw/Mn = 1.98
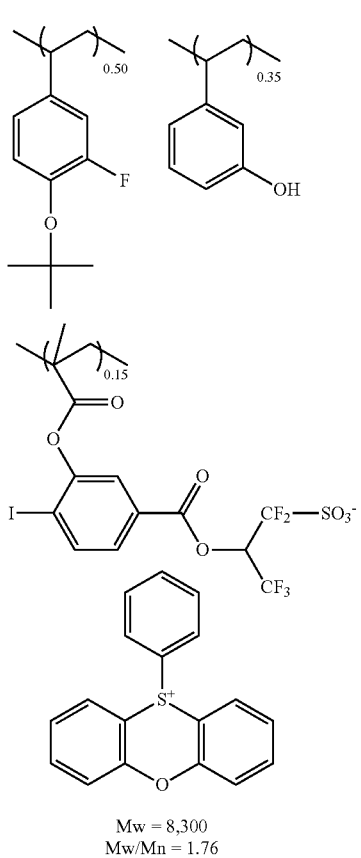
Mw = 8,300
Mw/Mn = 1.76
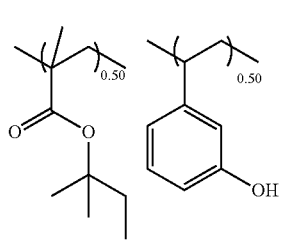
Polymer 5
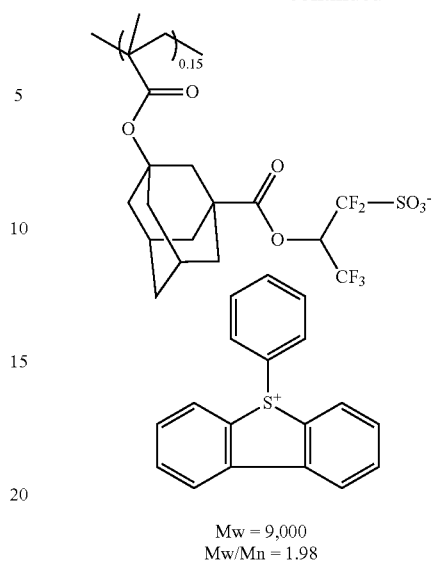
Mw = 9,000
Mw/Mn = 1.98
Polymer 4
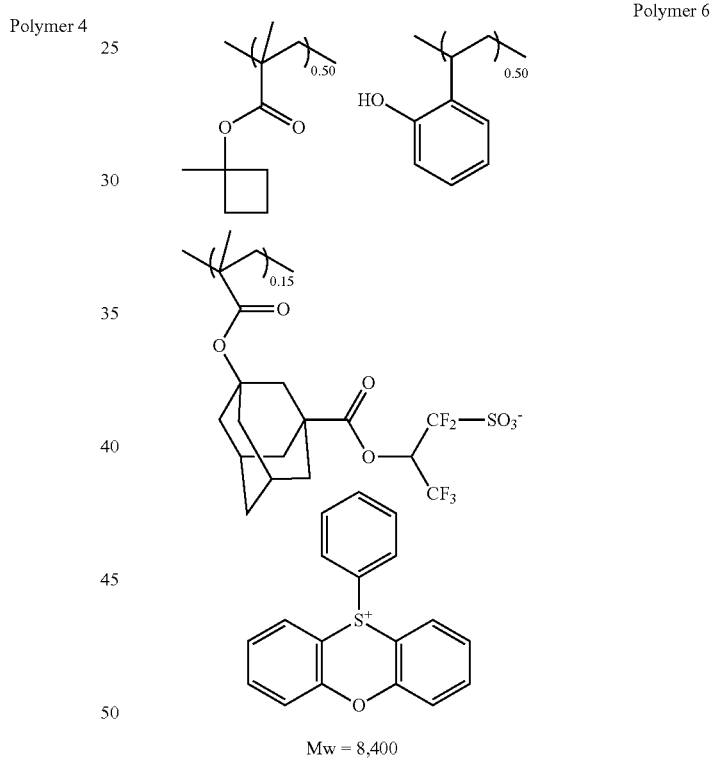
Mw = 8,400
Mw/Mn = 1.91
Polymer 6
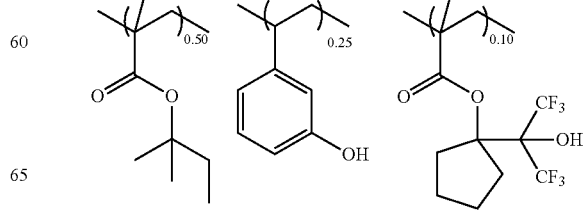
Polymer 7

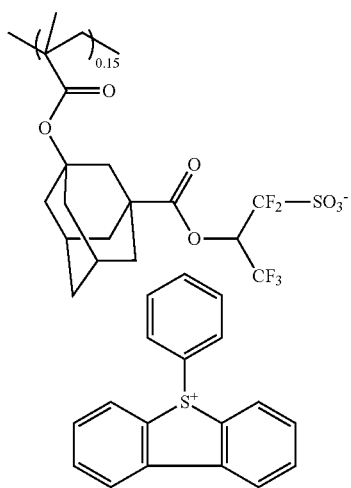
Mw = 9,000
Mw/Mn = 1.91
Polymer 8
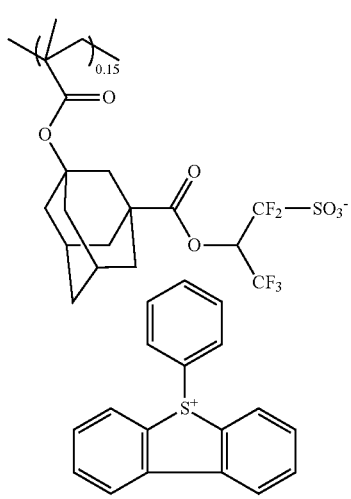
Mw = 9,200
Mw/Mn = 1.81
Polymer 9
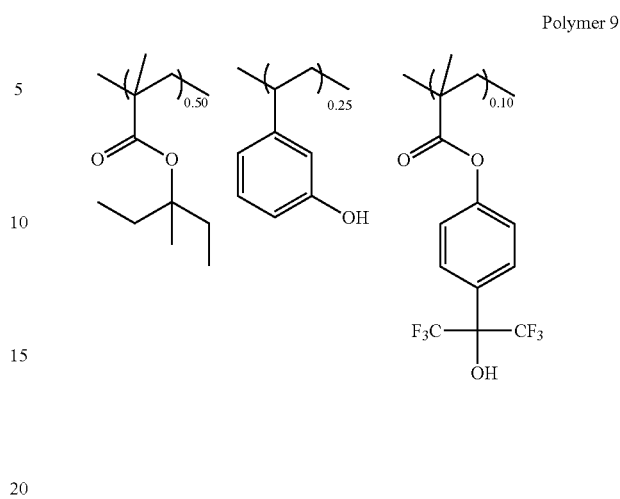
Mw = 9,600
Mw/Mn = 1.79
Polymer 10
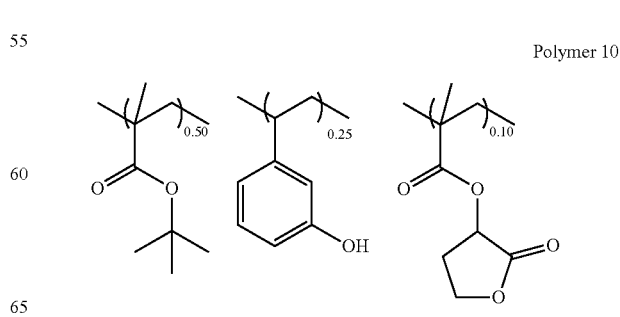

-continued
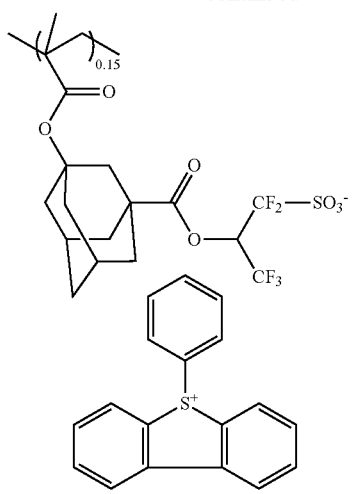
Mw = 9,300
Mw/Mn = 1.78
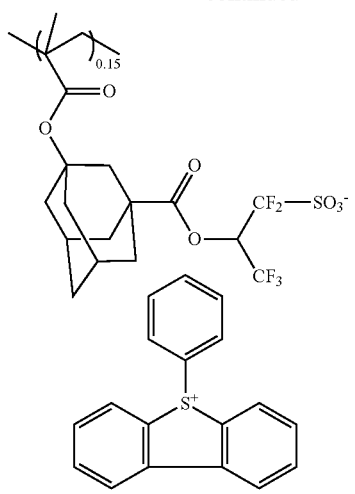
Mw = 9,700
Mw/Mn = 1.95
Polymer 11
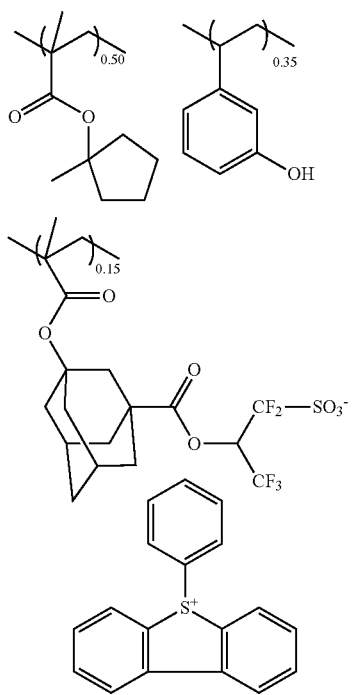
Mw = 9,000
Mw/Mn = 1.98
Comparative Polymer 1
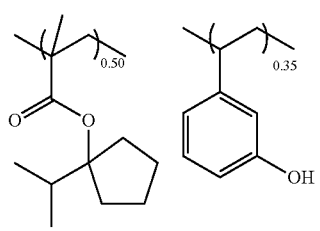
Comparative Polymer 2
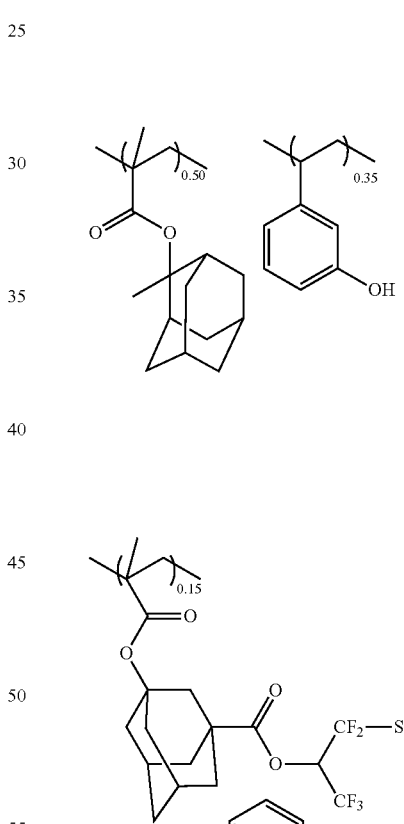
Mw = 8,100
Mw/Mn = 1.85

Comparative Polymer 3

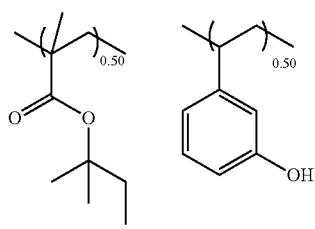

Mw = 9,100
Mw/Mn = 1.55

Preparation Examples 1 to 22 & Comparative Preparation Examples 1 to 3

Preparation of Resist Compositions

Resist compositions were prepared by dissolving the components in a solvent in accordance with the recipe shown in Table 1, and filtering through a filter having a pore size of 0.2 µm. The solvent contained 100 ppm of surfactant FC-4430 (3M).

The components in Table 1 are as identified below.

Acid generator: PAG 1

PAG 1

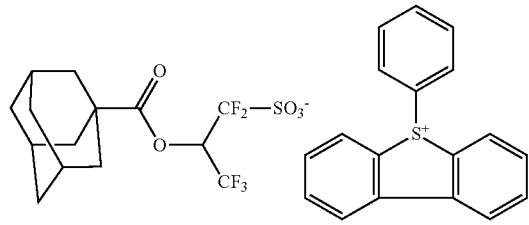

Quenchers: Quenchers 1 to 13

Quencher 1

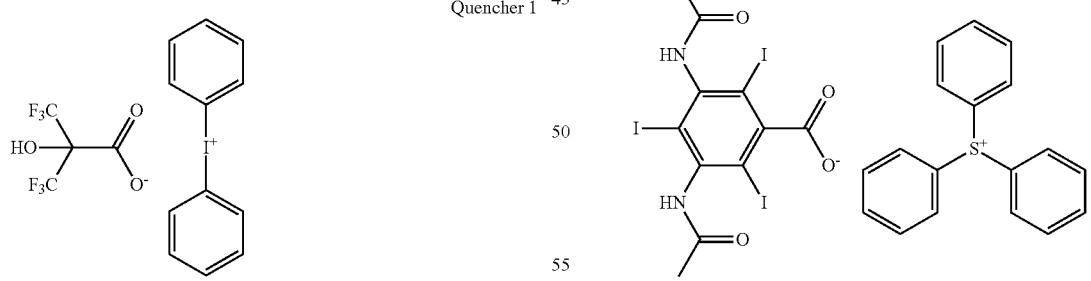

Quencher 2

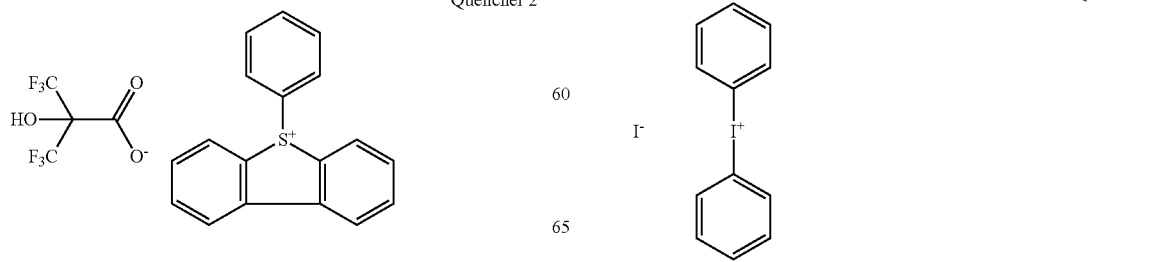

Quencher 3

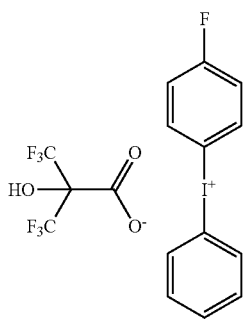

Quencher 4

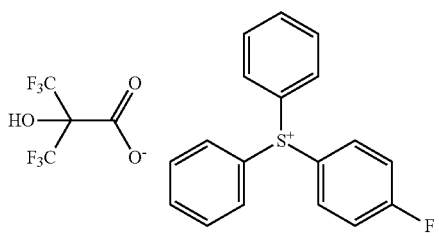

Quencher 5

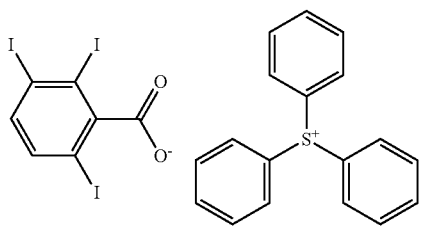

Quencher 6

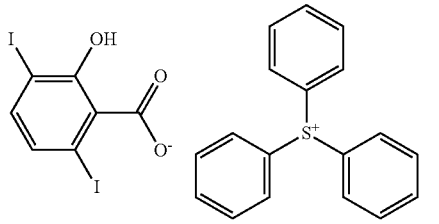

Quencher 7

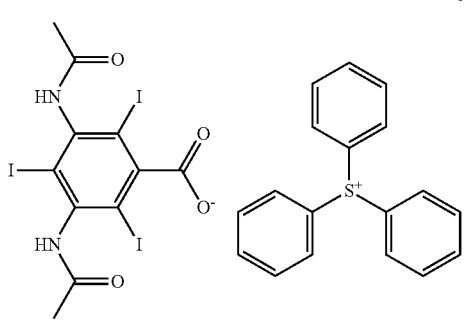

Quencher 8

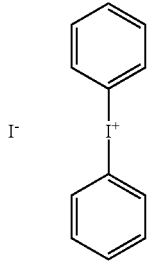

Quencher 9

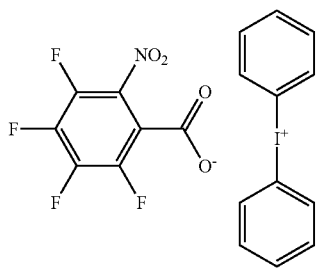

Quencher 10

Quencher 11

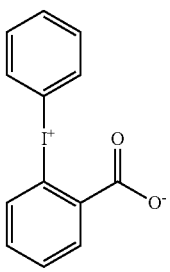

Quencher 12

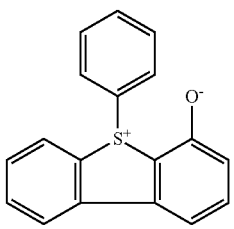

Quencher 13

Organic Solvents:
PGMEA (propylene glycol monomethyl ether acetate)
CyH (cyclohexanone)
PGME (propylene glycol monomethyl ether)
GBL (γ-butyrolactone)
DAA (diacetone alcohol)

TABLE 1

| | Resist composition | Polymer (pbw) | Acid generator (pbw) | Quencher (pbw) | Solvents (pbw) |
|---|---|---|---|---|---|
| Preparation Example 1 | R-1 | Polymer 1 (100) | — | Quencher 1 (6.0) | PGMEA (1,000) CyH (1,000) GBL (200) |
| Preparation Example 2 | R-2 | Polymer 2 (100) | — | Quencher 1 (6.0) | PGMEA (1,000) CyH (1,100) PGME (100) |
| Preparation Example 3 | R-3 | Polymer 3 (100) | — | Quencher 1 (6.0) | PGMEA (1,000) CyH (1,000) GBL (200) |
| Preparation Example 4 | R-4 | Polymer 4 (100) | — | Quencher 1 (6.0) | PGMEA (2,000) DAA (400) |
| Preparation Example 5 | R-5 | Polymer 5 (100) | — | Quencher 2 (6.0) | PGMEA (2,000) DAA (400) |
| Preparation Example 6 | R-6 | Polymer 6 (100) | — | Quencher 2 (6.0) | PGMEA (2,000) DAA (400) |
| Preparation Example 7 | R-7 | Polymer 7 (100) | — | Quencher 2 (6.0) | PGMEA (2,000) DAA (400) |
| Preparation Example 8 | R-8 | Polymer 8 (100) | — | Quencher 2 (6.0) | PGMEA (2,000) DAA (400) |
| Preparation Example 9 | R-9 | Polymer 9 (100) | — | Quencher 2 (6.0) | PGMEA (2,000) DAA (400) |
| Preparation Example 10 | R-10 | Polymer 10 (100) | — | Quencher 2 (6.0) | PGMEA (2,000) DAA (400) |
| Preparation Example 11 | R-11 | Polymer 11 (100) | — | Quencher 2 (6.0) | PGMEA (2,000) DAA (400) |
| Preparation Example 12 | R-12 | Polymer 7 (100) | — | Quencher 3 (9.0) | PGMEA (2,000) DAA (400) |
| Preparation Example 13 | R-13 | Polymer 7 (100) | — | Quencher 4 (9.0) | PGMEA (2,000) DAA (400) |
| Preparation Example 14 | R-14 | Polymer 7 (100) | — | Quencher 5 (9.0) | PGMEA (2,000) DAA (400) |
| Preparation Example 15 | R-15 | Polymer 7 (100) | — | Quencher 6 (9.0) | PGMEA (2,000) DAA (400) |
| Preparation Example 16 | R-16 | Polymer 7 (100) | — | Quencher 7 (9.0) | PGMEA (2,000) DAA (400) |

TABLE 1-continued

| | Resist composition | Polymer (pbw) | Acid generator (pbw) | Quencher (pbw) | Solvents (pbw) |
|---|---|---|---|---|---|
| Preparation Example 17 | R-17 | Polymer 7 (100) | — | Quencher 8 (9.0) | PGMEA (2,000) DAA (400) |
| Preparation Example 18 | R-18 | Polymer 7 (100) | — | Quencher 9 (9.0) | PGMEA (2,000) DAA (400) |
| Preparation Example 19 | R-19 | Polymer 7 (100) | — | Quencher 10 (9.0) | PGMEA (2,000) DAA (400) |
| Preparation Example 20 | R-20 | Polymer 7 (100) | — | Quencher 11 (9.0) | PGMEA (2,000) DAA (400) |
| Preparation Example 21 | R-21 | Polymer 7 (100) | — | Quencher 12 (9.0) | PGMEA (2,000) DAA (400) |
| Preparation Example 22 | R-22 | Polymer 7 (100) | — | Quencher 13 (10.0) | PGMEA (2,000) DAA (400) |
| Comparative Preparation Example 1 | CR-1 | Comparative Polymer 1 (100) | — | Quencher 1 (6.0) | PGMEA (2,000) DAA (400) |
| Comparative Preparation Example 2 | CR-2 | Comparative Polymer 2 (100) | — | Quencher 1 (6.0) | PGMEA (2,000) DAA (400) |
| Comparative Preparation Example 3 | CR-3 | Comparative Polymer 3 (100) | PAG 1 (20) | Quencher 1 (6.0) | PGMEA (2,000) DAA (400) |

Examples 1-1 to 1-28 & Comparative Examples 1-1 to 1-5

EB Lithography Test

A silicon substrate was coated with an antireflective coating of 60 nm thick (DUV-42, Nissan Chemical Corp.). Each of the resist compositions (R-1 to R-22, CR-1 to CR-3) was spin coated on the substrate and prebaked on a hotplate at 105° C. for 60 seconds to form a resist film of 30 nm thick. The resist film was exposed to electron beam using an EB lithography system ELS-F125 (Elionix Co., Ltd., accelerating voltage 125 kV). In Examples 1-1 to 1-15 and Comparative Examples 1-1 to 1-4, the resist film was baked (PEB) on a hotplate at the temperature shown in Table 2 for 60 seconds. In Example 1-16, the resist film was baked (PEB) in an air chamber at the temperature shown in Table 2 for 60 seconds. In Example 1-17, the resist film was baked (PEB) in an air chamber at the temperature shown in Table 2 for 60 seconds and then placed in a chamber of 1 vol % triethylamine-containing nitrogen atmosphere at 23° C. for 60 seconds. In Examples 1-18 to 1-28 and Comparative Example 1-5, PEB was omitted. Finally the resist film was developed in a 2.38 wt % TMAH aqueous solution at 23° C. for 30 seconds to form a line and space (L/S) pattern having a line size of 15 nm and a pitch of 30 nm.

The exposure dose that provides a 15-nm 1:1 L/S pattern is reported as sensitivity. By observation under CD-SEM (CG-5000, Hitachi High-Technologies Corp.), the L/S pattern was measured for LWR.

The results are shown in Table 2.

TABLE 2

| | Resist composition | PEB temperature (° C.) | Sensitivity (μC/cm²) | LWR (nm) |
|---|---|---|---|---|
| Example 1-1 | R-1 | 65 | 320 | 3.8 |
| Example 1-2 | R-2 | 50 | 260 | 3.9 |
| Example 1-3 | R-3 | 50 | 240 | 3.8 |
| Example 1-4 | R-4 | 50 | 235 | 3.8 |
| Example 1-5 | R-5 | 55 | 310 | 3.1 |
| Example 1-6 | R-6 | 55 | 270 | 3.1 |
| Example 1-7 | R-7 | 55 | 290 | 3.3 |
| Example 1-8 | R-8 | 55 | 310 | 3.2 |
| Example 1-9 | R-9 | 55 | 310 | 3.3 |
| Example 1-10 | R-10 | 60 | 330 | 3.0 |
| Example 1-11 | R-11 | 50 | 310 | 3.3 |
| Example 1-12 | R-5 | 30 | 420 | 4.5 |
| Example 1-13 | R-5 | 40 | 390 | 3.3 |
| Example 1-14 | R-5 | 60 | 280 | 3.1 |
| Example 1-15 | R-5 | 70 | 210 | 3.8 |
| Example 1-16 | R-5 | 55 | 280 | 2.8 |
| Example 1-17 | R-5 | 55 | 280 | 3.0 |
| Example 1-18 | R-12 | — | 830 | 4.0 |
| Example 1-19 | R-13 | — | 830 | 4.0 |
| Example 1-20 | R-14 | — | 830 | 4.0 |
| Example 1-21 | R-15 | — | 830 | 4.0 |
| Example 1-22 | R-16 | — | 880 | 3.8 |
| Example 1-23 | R-17 | — | 860 | 3.9 |
| Example 1-24 | R-18 | — | 820 | 4.4 |
| Example 1-25 | R-19 | — | 830 | 4.0 |
| Example 1-26 | R-20 | — | 820 | 4.6 |
| Example 1-27 | R-21 | — | 830 | 4.0 |
| Example 1-28 | R-22 | — | 860 | 4.3 |
| Comparative Example 1-1 | R-5 | 80 | 250 | 5.2 |
| Comparative Example 1-2 | CR-1 | 50 | 350 | 5.9 |
| Comparative Example 1-3 | CR-2 | 50 | pattern not resolved | — |
| Comparative Example 1-4 | CR-3 | 50 | pattern not resolved | — |
| Comparative Example 1-5 | CR-3 | — | pattern not resolved | — |

Example 2-1 & Comparative Example 2-1

EUV Lithography Test

The resist composition (R-5) was spin coated on a silicon substrate having a 20-nm coating of silicon-containing spin-on hard mask SHB-A940 (Shin-Etsu Chemical Co., Ltd., Si content 43 wt %) and prebaked on a hotplate at 105° C. for 60 seconds to form a resist film of 30 nm thick. Using an EUV scanner NXE3300 (ASML, NA 0.33, dipole illumination), the resist film was exposed to EUV. The resist film was baked (PEB) on a hotplate at the temperature shown in Table 3 for 60 seconds and developed in a 2.38 wt % TMAH aqueous solution for 30 seconds to form a 1:1 line-and-space pattern having a size of 13 nm.

The exposure dose that provides a 13-nm 1:1 L/S pattern is reported as sensitivity. By observation under CD-SEM (CG-5000, Hitachi High-Technologies Corp.), the L/S pattern was measured for LWR.

The results are shown in Table 3.

TABLE 3

| | Resist composition | PEB temperature (° C.) | Sensitivity (mJ/cm$^2$) | LWR (nm) |
|---|---|---|---|---|
| Example 2-1 | R-5 | 70 | 43 | 4.2 |
| Comparative Example 2-1 | R-5 | 75 | 28 | 5.0 |

It is demonstrated in Tables 2 and 3 that the pattern forming process of the invention offers a low LWR and a relatively high sensitivity. The processes of Comparative Examples show an inferior balance of sensitivity and LWR to the inventive process. Some Comparative Examples showed a high sensitivity, but poor LWR, and some were poor in both sensitivity and LWR. The resist composition containing the additive acid generator failed pattern formation because the exposed region was not dissolved in alkaline developer.

The process involving using a resist composition comprising as base resin a polymer comprising recurring units having a $C_4$-$C_6$ acid labile group with a low dissolution inhibitory ability and a high activation energy and recurring units capable of generating a backbone-bound acid, and optionally post-exposure baking (PEB) the resist film at a low temperature of 30 to 70° C. is successful in minimizing acid diffusion, and improving resolution and LWR in a good balance thereof with sensitivity. Therefore the pattern forming process of the invention is quite effective in the course of VLSI manufacture and mask pattern formation.

Japanese Patent Application No. 2017-229144 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A process for forming a pattern, comprising the steps of:
   (i) exposing a resist film comprising a base resin to high-energy radiation,
   (ii) optionally post-exposure baking the resist film at 30 to 70° C., and
   (iii) developing the resist film after step (ii),
   wherein the base resin consists of
   recurring units having the formula (a1) and/or recurring units having the formula (a2), and
   recurring units capable of generating a polymer backbone-bound acid upon exposure, and optionally one or more recurring unit(s) selected from the group consisting of
   recurring units having a phenolic hydroxyl group as an adhesive group,
   recurring units having another adhesive group selected from hydroxyl group other than the phenolic hydroxyl, carboxyl group, lactone ring, carbonate bond, thiocarbonate bond, carbonyl group, cyclic acetal group, ether bond, ester bond, sulfonic acid ester bond, cyano group, amide group, —O—C(=O)—S—, and —O—C(=O)—NH—,
   recurring units derived from indene, benzofuran, benzothiophene, acenaphthylene, chromone, coumarin, norbornadiene or derivatives thereof, and
   recurring units derived from styrene, vinylnaphthalene, vinylanthracene, vinylpyrene, or methyleneindane,

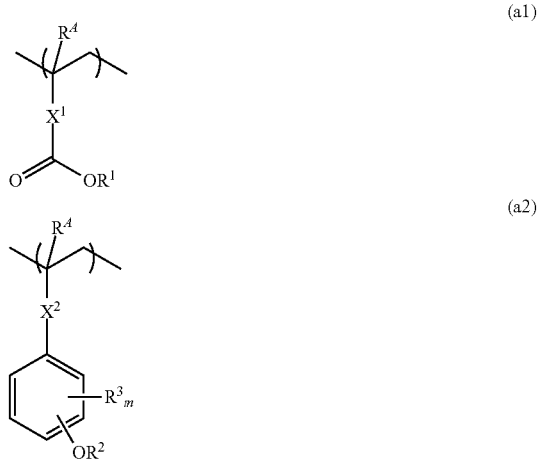

wherein $R^A$ is each independently hydrogen or methyl, $R^1$ and $R^2$ are each independently a $C_4$-$C_6$ tertiary alkyl group, $R^3$ is each independently fluorine or methyl, m is an integer of 0 to 4, $X^1$ is a single bond, phenylene group, naphthylene group, or a $C_1$-$C_{12}$ linking group containing at least one moiety selected from an ester bond, lactone ring, phenylene and naphthylene, and $X^2$ is a single bond, ester bond or amide bond,
   wherein the recurring units derived from indene, benzofuran, benzothiophene, acenaphthylene, chromone, coumarin, norbornadiene or derivatives thereof are recurring units derived from monomers selected from the group consisting of the following formulae:

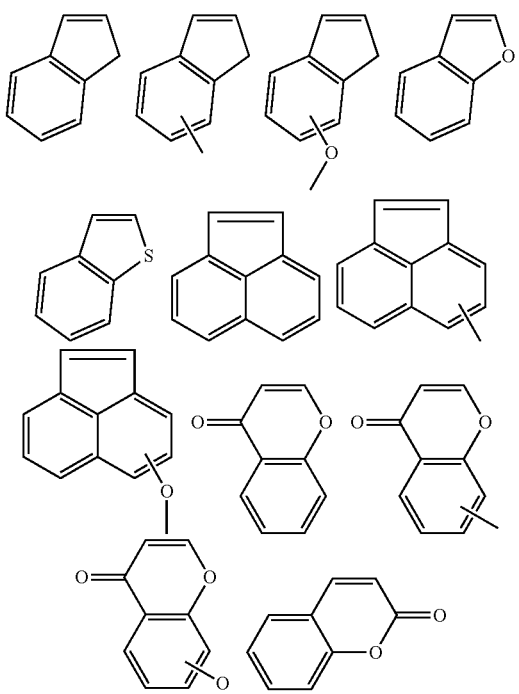

wherein the resist film further comprises a quencher consisting of an onium salt of carboxylic acid having the formula (1)

$$R^{21}-CO_2^- M_A^+ \quad (1)$$

wherein $R^{21}$ is a $C_1$-$C_{40}$ monovalent hydrocarbon group which may contain a heteroatom, and $M_A^+$ is an onium cation.

2. The pattern forming process of claim 1 wherein the $C_4$-$C_6$ tertiary alkyl group is tert-butyl, tert-pentyl, 1-methylcyclobutyl, 3-methyl-3-pentyl, or 1-methylcyclopentyl.

3. The pattern forming process of claim 1 wherein the recurring units capable of generating a polymer backbone-bound acid upon exposure have the formula (b1) or (b2):

wherein $R^A$ is as defined above,

R is hydrogen or trifluoromethyl, $Y^1$ is a single bond, —C(=O)—O—$Z^1$— or —C(=O)—NH—$Z^1$—, $Y^2$ is a single bond, methylene, ethylene, phenylene, fluorinated phenylene, —O—$Z^1$—, —C(=O)—O—$Z^1$—, or —C(=O)—NH—$Z^1$—, $Z^1$ is a $C_1$-$C_{10}$ alkanediyl, phenylene, or $C_1$-$C_{10}$ alkenediyl group, in which at least one hydrogen may be substituted by hydroxyl, and at least one carbon may be substituted by carbonyl, ester bond or ether bond, $R^{11}$ to $R^{16}$ are each independently a $C_1$-$C_{20}$ monovalent hydrocarbon group which may contain a heteroatom, any two of $R^{11}$ to $R^{13}$ may bond together directly or via a methylene group or ether bond to form a ring with the sulfur atom to which they are attached, and any two of $R^{14}$ to $R^{16}$ may bond together directly or via a methylene group or ether bond to form a ring with the sulfur atom to which they are attached.

4. The pattern forming process of claim 1 wherein in step (ii), the resist film is not baked.

5. The pattern forming process of claim 1 wherein in step (ii), the resist film is post-exposure baked at a temperature of 30 to 70° C.

6. The pattern forming process of claim 5 wherein the post-exposure bake is carried out in an atmosphere at a temperature of 30 to 70° C.

7. The pattern forming process of claim 5 wherein the baking temperature is in a range of 35 to 65° C.

8. The pattern forming process of claim 7 wherein the baking temperature is in a range of 40 to 60° C.

9. The pattern forming process of claim 1, further comprising, between steps (ii) and (iii), the step of exposing the resist film to an atmosphere containing a basic substance to neutralize the acid in the resist film.

10. The pattern forming process of claim 1 wherein step (iii) includes developing the resist film in an alkaline aqueous solution as a developer to form a positive pattern.

11. The pattern forming process of claim 1 wherein the high-energy radiation is EUV of wavelength 3 to 15 nm.

12. The pattern forming process of claim 1 wherein the high-energy radiation is EB at an accelerating voltage of 1 to 150 kV.

13. The pattern forming process of claim 1 wherein $X^2$ is a single bond.

14. The pattern forming process of claim 1 wherein in step (ii), the resist film is post-exposure baked at a temperature of 30 to 55° C.

\* \* \* \* \*